(12) United States Patent
Abe et al.

(10) Patent No.: US 6,556,007 B1
(45) Date of Patent: Apr. 29, 2003

(54) BEARING SENSOR HAVING MAGNETO RESISTIVE ELEMENTS

(75) Inventors: Yasunori Abe, Mohka (JP); Osamu Shimoe, Kumagaya (JP); Yukimasa Shonowaki, Mohka (JP); Hiromitsu Itabashi, Kumagaya (JP); Hiroyuki Mima, Hitachinaka (JP); Hitoshi Harata, Utsunomiya (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 10/057,979

(22) Filed: Jan. 29, 2002

(30) Foreign Application Priority Data

Feb. 6, 2001 (JP) ........................................ 2001-029011
Mar. 30, 2001 (JP) ........................................ 2001-098333

(51) Int. Cl.⁷ .............................................. G01R 33/02
(52) U.S. Cl. ...................... 324/252; 324/260; 33/355 R
(58) Field of Search ................................ 324/252, 247, 324/260, 207.21, 207.22, 249; 33/355 R, 356, 361, 363, 351; 338/32 R; 368/10, 14

(56) References Cited

U.S. PATENT DOCUMENTS 5,435,070 A * 7/1995 Kilaian ........................ 33/361
6,070,333 A * 6/2000 Kutzner et al. ............. 33/355 R

FOREIGN PATENT DOCUMENTS

JP 5-157565 6/1993

OTHER PUBLICATIONS

Hiroyuki Chubachi, et al. "Development of Electronic Compass Watch Using Magnetoresistive Device". Journal of the Horological Institute of Japan No. 149. pp. 12–20.

* cited by examiner

*Primary Examiner*—Edward Lefkowitz
*Assistant Examiner*—Subhash Zaveri
(74) *Attorney, Agent, or Firm*—Sughrue Mion, PLLC

(57) ABSTRACT

To provide a bearing sensor having a thin plane coil for applying a biasing magnetic field and at least one magneto resistive element pair (a first magneto resistive thin plate and a second magneto resistive thin plate) crossing opposed conductor sides of the coil. The plane coil has at least one pair of opposed conductor sides (a first side and a second side). The first magneto resistive thin plate and the first side cross one another at an angle more than 30 degrees and less than 90 degrees. The second magneto resistive thin plate and the second side cross one another at an angle more than 30 degrees and less than 90 degrees. While biasing magnetic fields in opposite directions are applied to the magneto resistive thin plates, respectively, intermediate potentials of the magneto resistive element pair are measured to determine bearings based on the difference between the intermediate potentials.

41 Claims, 19 Drawing Sheets

102
101

BEARING SENSOR HAVING MAGNETO RESISTIVE ELEMENTS

BACKGROUND OF THE INVENTION

1. Field of the Invention

The present invention relates to a bearing sensor having magneto resistive elements and a process for bearings, in particular, to a bearing sensor and a process for bearings in which bearings are measured by applying a biasing magnetic field to the magneto resistive elements.

2. Description of the Related Art

When a current is applied to a magneto resistive element in a direction of an easy axis of magnetization, and at the same time, a magnetic field is applied in a direction perpendicular thereto, a resistance in the current direction has a magneto-resistance effect, that is, it is reduced depending on a magnetic field strength. A relationship between the resistance and the applied magnetic field strength can substantially be approximated by a quadric as shown in FIG. 24 and as follows:

$$R = R_0(1 - \alpha(H/Hk)^2),$$

where reference symbol $R_0$ denotes a resistance when no magnetic field is applied, reference symbol $\alpha$ denotes a resistivity variation ratio, and reference symbol $Hk$ denotes a saturation magnetic field.

When a biasing magnetic field on the order of 1/2-Hk is applied to the magneto resistive element, there is a substantially linear relationship between an external magnetic field and the resistance. Since the maximum horizontal component of the earth magnetism is 0.4 Oe, bearings can be measured by applying an appropriate bias.

There is used a bearing sensor comprising a full bridge constituted by four magneto resistive elements 91, 92, 93, and 94 that are orthogonal to each other as shown in FIG. 25, and two bias coils 101 and 102 that are wound around a holder mounted outside of the magneto resistive elements so that two orthogonal biasing magnetic fields can be applied both at an angle of 45 degrees with respect to the current directions of the magneto resistive elements. FIG. 26 is a schematic cross-sectional view thereof, and FIG. 27 is a perspective view thereof In measurement of bearings, a +x-direction bias is applied by one bias coil 101 (referred to as an x-direction coil) to the four magneto resistive elements 91, 92, 93, and 94 constituting the full bridge to measure an intermediate potential difference among the magneto resistive elements, and then, a −x-direction bias is applied by the same bias coil 101 to the magneto resistive elements to measure the intermediate potential difference among the magneto resistive elements. A difference between the intermediate potential differences measured when the +x-direction bias is applied and when the −x-direction bias is applied is proportional to sin θ, the angle θ being an angle between the horizontal component of the earth magnetism and the x-axis.

Next, a +y-direction bias is applied by the other bias coil 102 (referred to as a y-direction coil) to the four magneto resistive elements 91, 92, 93, and 94 constituting the full bridge to measure an intermediate potential difference among the magneto resistive elements, and then, a −y-direction bias is applied by the same bias coil 102 to the magneto resistive elements to measure the intermediate potential difference among the magneto resistive elements. A difference between the intermediate potential differences measured when the +y-direction bias is applied and when the −y-direction bias is applied is proportional to sin(π/2−θ), that is, cos θ.

From the y-directional output Vy and the x-directional output Vx, the bearings can be measured as the direction θ of the horizontal component of the earth magnetism as follows:

$$\theta = a\tan(Vx/Vy).$$

While the above description is true in terms of theory, the relationship between the magnetic field applied to the magneto resistive element and the resistance involves a hysteresis as shown in FIG. 28, rather than FIG. 24. It is said that when the applied magnetic field strength is increased, it reaches a level of saturation via the upper curve in FIG. 28, and when it is decreased from the level, it traces the lower curve.

Therefore, when measuring bearings, the saturation magnetic field is applied before the application of the biasing magnetic field in consideration of the hysteresis.

For example, as disclosed in Japanese Patent Laid-Open No. 5-157565, when measuring bearings using the bearing sensor composed of the magneto resistive elements and two orthogonal bias coils as described above, the saturation magnetic field Hk is applied in +x direction, and then the intermediate potential difference between the magneto resistive element pairs is measured while applying the +x-direction biasing magnetic field Hb. Then, the saturation magnetic field −Hk is applied in −x direction by the same bias coil, and then the intermediate potential difference between the magneto resistive element pairs is measured while applying the −x-direction biasing magnetic field −Hb. The difference between the intermediate potential differences at the time of applications of the +x-direction bias and the −x-direction bias thus obtained is defined as an x-direction output Vx.

Then, the saturation magnetic field is applied in the +y direction by the other bias coil, and then the intermediate potential difference between the magneto resistive element pairs is measured while applying the +y-direction biasing magnetic field. Then, the saturation magnetic field is applied in the −y direction by the same bias coil, and then the intermediate potential difference between the magneto resistive element pairs is measured while applying the −y-direction biasing magnetic field. The difference between the intermediate potential differences at the time of applications of the +y-direction bias and the −y-direction bias thus obtained is defined as an y-direction output Vy. Based on the Vx and Vy, bearings are measured in the manner as described above.

As the orthogonal four magneto resistive elements assembled into the full bridge described above, zigzag magneto resistive thin plates formed by etching a Ni-based alloy film deposited on one ceramic substrate may be used. Thus, the magneto resistive elements can be quite small and thin. However, since the two bias coil wound around them in x direction and y direction are provided outside the magneto resistive element bridge, the bearing sensor has, at the smallest, a thickness of the order of 3 mm and an area of the order of 10 mm×10 mm. Due to such a thickness, a wristwatch incorporating the bearing sensor has a large size.

In the procedure of measuring bearings has been explained in the above description, it is required to carry out measuring four times because the bias is applied in +x direction and −x direction by the x-direction coil, the bias is applied in +y direction and −y direction by the y-direction coil, and then calculation is carried out.

Furthermore, in order to eliminate the effect of the hysteresis of the magneto resistive element, before the biasing magnetic field is applied, the saturation magnetic field of the same direction as that of the biasing magnetic field is applied. Application of the biasing magnetic field after the application of the saturation magnetic field make the gradient of the curve for the resistance of the magneto resistive element and the magnetic field (see FIG. 28) be decreased, so that the output to be measured becomes low.

SUMMARY OF THE INVENTION

Therefore, an object of the present invention is to provide a bearing sensor of a significantly reduced thickness and area.

Furthermore, another object of the present invention is to provide a bearing sensor in which the number of applications of a current to a coil and the number of measurements are less than before.

Furthermore, another object of the present invention is to provide a process for bearings in which the number of applications of a current to a coil and the number of measurements are less than before.

Furthermore, another object of the present invention is to provide a process for bearings with an increased output.

A bearing sensor according to the present invention comprises a plane coil having at least a pair of opposed conductor sides, the opposed conductor side pair composed of a first side and a second side which are parallel to one another, and at least one magneto resistive element pair of two magneto resistive thin plates located on a plane parallel to and adjacent to the plane coil, in which the magneto resistive element pair has a first magneto resistive thin plate and a second magneto resistive thin plate, the first magneto resistive thin plate of the magneto resistive element pair has a longitudinal direction crossing only the first side at an angle of more than 30 degrees and less than 90 degrees, the second magneto resistive thin plate of the magneto resistive element pair has a longitudinal direction crossing only the second side at an angle of more than 30 degrees and less than 90 degrees, the longitudinal direction of the first magneto resistive thin plate is not parallel to the longitudinal direction of the second magneto resistive thin plate, and each of the magneto resistive thin plates is electrically connected at one terminal thereof to the other magneto resistive thin plate and a voltage for measuring bearings is applied between the other terminals so that an intermediate potential is taken out from the one terminal according to bearings.

The plane coil may have an oblique section or bent portion between the opposed conductor sides parallel to each other so far as it is linear in the vicinity of points where the magneto resistive thin plates cross it. A preferable example of the plane coil suitable for the present invention is a plane coil having two pairs of opposed conductor sides. There may be an oblique section or bent R-shaped section between the two pairs of opposed conductor sides. When the two pairs of opposed conductor sides are directly connected to each other and there is no oblique or R-shaped section but the connections, the coil is referred to as a parallelogram plane coil.

More preferable plane coil used in the present invention is a coil having two pairs of the opposed conductor sides that are parallel to each other, the two pairs of the opposed conductor sides constituting at least partially four sides of a rectangle. If the two pairs of the opposed conductor sides that are parallel to each other are perpendicular to each other, the parallel coil sides constitute at least partially four sides of a rectangle. There may be an oblique section or bent R-shaped portion at the connections between the opposed conductor sides so far as the wire is linear and parallel to the wire on the other side in the vicinity of the points where it crosses the magneto resistive thin plates.

The bearing sensor may have two magneto resistive element pairs. In such a case, the longitudinal direction of one of the magneto resistive thin plates (first magneto resistive thin plate) in each of the two magneto resistive element pairs may cross only a same one side (first side) of the opposed conductor side pair of the plane coil, and the longitudinal direction of the other of the magneto resistive thin plates (second magneto resistive thin plate) in each of the two magneto resistive element pairs may cross only the opposed side (second side) of the opposed conductor side pair of the plane coil, each of the first magneto resistive thin plates in the two magneto resistive element pairs may cross only a first side of the opposed conductor side pair, each of the second magneto resistive thin plates in the two magneto resistive element pairs may cross only a second side, opposite to the first side, of the opposed conductor side pair, the longitudinal directions of the first magneto resistive thin plates crossing the first side of the opposed conductor side pair may not be parallel to one another, and the longitudinal directions of the second magneto resistive thin plates crossing the second side of the opposed conductor side pair may not be parallel to one another. Alternatively, the first magneto resistive thin plate of one of the two magneto resistive element pairs may cross only the first side of one of the two opposed conductor side pairs, and the second magneto resistive thin plate of the magneto resistive element pair may cross only the second side of the opposed conductor side pair, and the first magneto resistive thin plate of the other of the two magneto resistive element pairs may cross only the first side of the other of the two opposed conductor side pairs, and the second magneto resistive thin plate of the other of the two magneto resistive element pairs may cross only the second side of the other of the two opposed conductor side pairs.

In the bearing sensor of the present invention, in the case where the two pairs of the opposed conductor sides constitute at least partially four sides of a rectangle, it is preferred that the bearing sensor has four magneto resistive element pairs, each of the magneto resistive element pairs having two magneto resistive thin plates composed of a first magneto resistive thin plate and a second magneto resistive thin plate, in which two first magneto resistive thin plates of two of the four magneto resistive element pairs cross only the first side of one of the two opposed conductor side pairs and two second magneto resistive thin plates of the two magneto resistive element pairs cross only the second side of the same opposed conductor side pair, while two first magneto resistive thin plates of the other two of the four magneto resistive element pairs cross only the first side of the other opposed conductor side pair and two second magneto resistive thin plates of the other two magneto resistive element pairs cross only the second side of the other opposed conductor side pair, the longitudinal directions of the two magneto resistive thin plates crossing the same side of the plane coil being not parallel to one another.

In the bearing sensor of the present invention, it is preferred that the angle at which the longitudinal direction of each of the magneto resistive thin plates crosses a side of the opposed conductor side pair of the plane coil is more than or equal to 45 degrees and less than 90 degrees, and the variation in the crossing is within +/−5 degrees. More preferably, the crossing angle is about 45 degrees.

In the bearing sensor of the present invention, it is preferred that the longitudinal direction of one of the magneto resistive thin plates in each of the magneto resistive element pairs is perpendicular to the longitudinal direction of the other of the magneto resistive thin plates in the same magneto resistive element pair. In addition, it is preferred that the longitudinal directions of the two magneto resistive thin plates crossing one side of the plane coil is perpendicular to each other.

As the plane coil used in the present invention, a cross-shaped plane coil wound along outside of a cross-shaped plane and having four pairs of the opposed conductor sides may be used, in which each side of the opposed conductor side pair is located between a top corner and a bottom corner on a side of a protrusion of the cross-shaped plane, the first side of each of the opposed conductor side pairs is parallel to the second side of the same opposed conductor side pair, the sides of two of the four opposed conductor side pairs is parallel to one another and perpendicular to the sides of the other two of the four opposed conductor side pairs.

In such a case, the bearing sensor has two magneto resistive element pairs, each of the magneto resistive element pairs having two magneto resistive thin plates composed of a first magneto resistive thin plate and a second magneto resistive thin plate.

Alternatively, the bearing sensor may have four magneto resistive element pairs, each of the magneto resistive element pairs having two magneto resistive thin plates composed of a first magneto resistive thin plate and a second magneto resistive thin plate, in which the first magneto resistive thin plates in two of the four magneto resistive element pairs cross, respectively, only the first sides, which are parallel to one another, in first two of the four opposed conductor side pairs, and the second magneto resistive thin plates in the two magneto resistive element pairs cross, respectively, only the second sides in the first two opposed conductor side pairs which are parallel to one another, while the first magneto resistive thin plates in the other two of the four magneto resistive element pairs cross, respectively, only the first sides of the other two of the four opposed conductor side pairs which are perpendicular to the first two opposed conductor side pairs and the second magneto resistive thin plates of the other two magneto resistive element pairs cross, respectively, only the second sides of the other two of the four opposed conductor side pairs, and the longitudinal direction of the first magneto resistive thin plate of the magneto resistive element pair at a protrusion of the cross-shaped plane coil is not parallel to the longitudinal direction of the first magneto resistive thin plate of the magneto resistive element pair at the opposite protrusion, and the longitudinal direction of the second magneto resistive thin plate of the magneto resistive element pair at the protrusion is not parallel to the longitudinal direction of the second magneto resistive thin plate of the magneto resistive element pair at the opposite protrusion.

In the bearing sensor having the cross-shaped plane coil of the present invention, it is preferred that the angle at which the longitudinal direction of each of the magneto resistive thin plates crosses a side of the opposed conductor side pair of the plane coil is more than or equal to 45 degrees and less than 90 degrees, and the variation in the crossing is within +/−5 degrees. More preferably, the crossing angle is about 45 degrees.

In the bearing sensor of the present invention, it is preferred that the longitudinal direction of one of the magneto resistive thin plates in each of the magneto resistive element pairs is perpendicular to the longitudinal direction of the other magneto resistive thin plates in the same magneto resistive element pair.

The bearing sensor of the present invention may comprise a plane coil having two pairs of opposed conductor sides parallel to one another, the two pairs of the opposed conductor sides constituting at least partially four sides of a rectangle, the opposed conductor side pair composed of a first side and a second side, and two magneto resistive element planes located at both sides of the plane coil and being parallel to and adjacent to the plane coil, in which each of the magneto resistive element planes includes four magneto resistive thin plates having a longitudinal direction crossing only a single side of the opposed conductor side pair at an angle of more than 30 degrees and less than 90 degrees, two magneto resistive thin plates of which the longitudinal directions cross a pair of the opposed conductor sides and are not parallel to one another constitute a magneto resistive element pair of the magneto resistive thin plates having a first magneto resistive thin plate and a second magneto resistive thin plate, the first and the second magneto resistive thin plates being applied opposite magnetic fields by a DC current flowing through the plane coil, each of the magneto resistive thin plates is electrically connected at one terminal thereof to the other and a voltage for measuring bearings is applied between the other terminals so that an intermediate potential output is taken out from the one terminal according to bearings.

In this case again, it is preferred that the angle at which the longitudinal direction of each of the magneto resistive thin plates crosses a side of the opposed conductor side pair of the plane coil is more than or equal to 45 degrees and less than 90 degrees, and the variation in the crossing is within +/−5 degrees. More preferably, the crossing angle is about 45 degrees.

For this bearing sensor, it is preferred that the longitudinal direction of one of the magneto resistive thin plates in each of the magneto resistive element pairs is perpendicular to the longitudinal direction of the other of the magneto resistive thin plates in the same magneto resistive element pair, and the longitudinal directions of two magneto resistive thin plates between which a side of the opposed conductor side pair is put are perpendicular to one another.

The bearing sensor of the present invention may comprise a magneto resistive element plane, and two plane coils located on both sides of the magneto resistive element plane and being parallel to and adjacent to the magneto resistive element plane, in which each of the two plane coils has at least two pairs of opposed conductor sides, the two pairs of the opposed conductor sides constituting at least four sides of a rectangle, the opposed conductor side pair composed of a first side and a second side which are parallel to one another, the magneto resistive element plane has two magneto resistive thin plates per a side of the opposed conductor side pair of the plane coils, the two magneto resistive thin plates having longitudinal directions crossing only the side of the opposed conductor side pair at an angle of more than 30 degrees and less than 90 degrees and being not parallel to one another, a magneto resistive element pair is composed of one of the magneto resistive thin plates crossing the first side of the opposed conductor side pair of the two plane coils and the magneto resistive thin plate crossing the second side of the opposed conductor side pair of the two plane coils and being not parallel to the longitudinal direction of the one of the magneto resistive thin plates, and each of the magneto resistive thin plates is electrically connected at one terminal thereof to the other and a voltage for measuring bearings is applied between the other terminals so that an intermediate potential output is taken out from the one terminal according to bearings.

In the bearing sensor, it is preferred that the angle at which the longitudinal direction of each of the magneto resistive thin plates crosses a side of the opposed conductor side pair of the plane coil is more than or equal to 45 degrees and less than 90 degrees. More preferably, the magneto resistive element plane has two magneto resistive thin plates per a side of the opposed conductor side pair of the plane coils, the two thin plates have longitudinal directions crossing only the side of the opposed conductor side pair at an angle of about 45 degrees and are perpendicular to one another, and longitudinal directions of two thin plates of a magneto resistive element pair are perpendicular to one another.

In the process for bearings according to the present invention, the bearing sensors described above are used. This process comprises the steps of:

passing a first DC current through the plane coil to apply to the magneto resistive thin plates a DC magnetic field enough to saturate a magnetization of the magneto resistive thin plates in the longitudinal direction of each of the magneto resistive thin plates;

passing a first biasing DC current opposite to the first DC current of a predetermined strength through the plane coil to apply a biasing DC magnetic field perpendicular to the longitudinal direction;

applying a voltage for measuring bearings between the other terminals of the magneto resistive element pairs to take out a first intermediate potential from the connected terminals of the magneto resistive element pairs during the application of the biasing DC magnetic field;

passing a second DC current opposite to the first DC current through the plane coil to apply to the magneto resistive thin plates a DC magnetic field enough to saturate a magnetization of the magneto resistive thin plates in the longitudinal direction of each of the magneto resistive thin plates;

passing a second biasing DC current opposite to the second DC current of a predetermined strength through the plane coil to apply a biasing DC magnetic field perpendicular to the longitudinal direction;

applying a voltage for measuring bearings between the other terminals of the magneto resistive element pairs to take out a second intermediate potential from the connected terminals of the magneto resistive element pairs during the application of the biasing DC magnetic field; and obtaining a difference between the first and the second intermediate potentials to measure bearings from the difference.

In the case where a bearing sensor having two or four magneto resistive element pairs is used, instead of the first and the second intermediate potentials, a first and a second intermediate potential differences between two magneto resistive element pairs crossing a same opposed conductor side pair are taken out, and a difference between the first and the second intermediate potential differences is obtained to measure bearings from the difference.

In the bearing sensor used for measuring bearings according to the present invention, it is preferred that the plane coil is a rectangle, the longitudinal direction of one of the magneto resistive thin plates in each of the magneto resistive element pairs is perpendicular to the longitudinal direction of the other of the magneto resistive thin plates in the same magneto resistive element pair, and the longitudinal directions of the magneto resistive thin plates crossing a same side of the plane coil are perpendicular to one another.

DETAILED DESCRIPTION OF THE PREFERRED EMBODIMENTS

EXAMPLE 1

Figure 1:
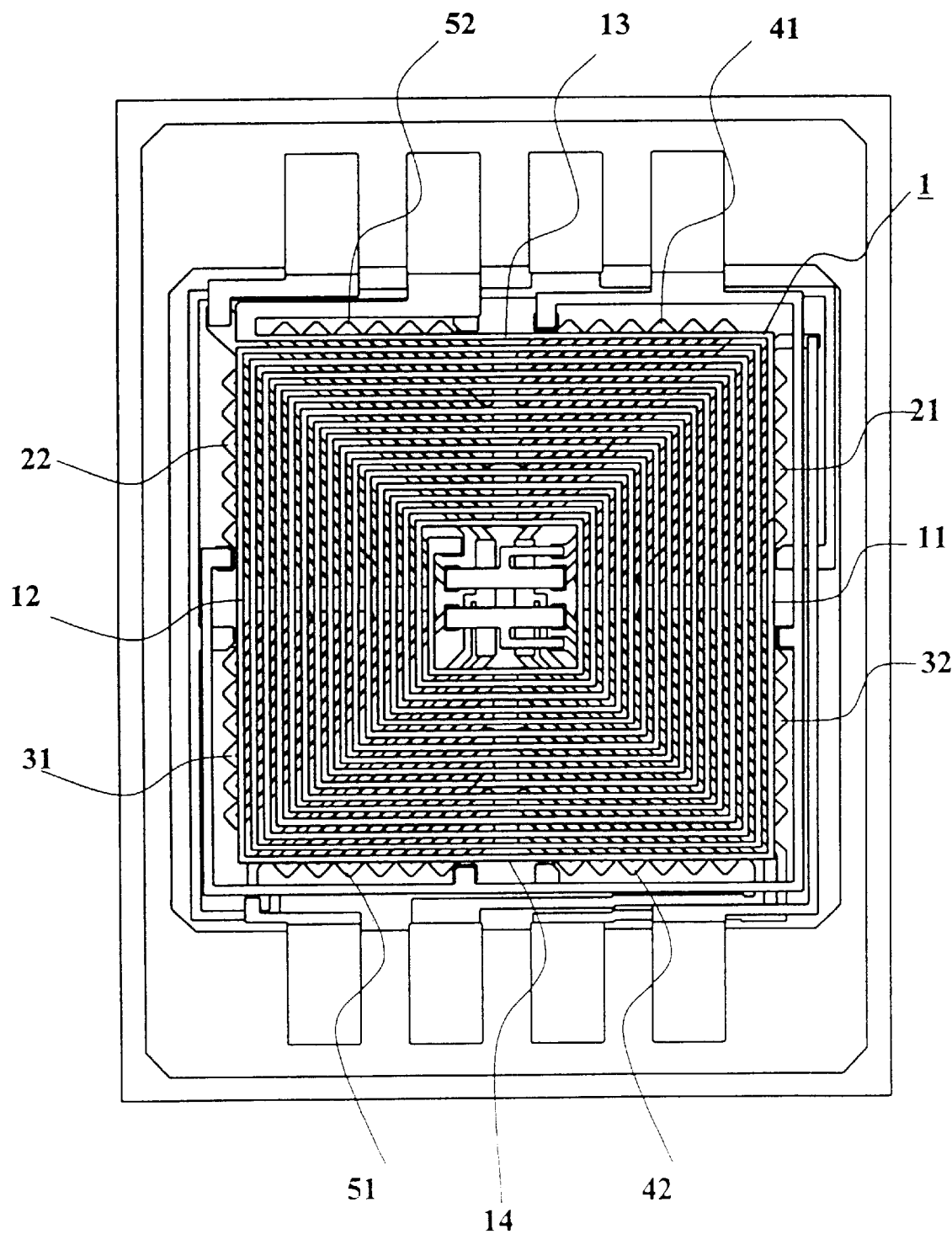
FIG. 1 is a plan view of a bearing sensor of EXAMPLE 1 of the present invention.

FIG. 1 is a plan view of a bearing sensor of EXAMPLE 1 of the present invention. In FIG. 1, reference numeral 1 denotes a plane coil of a shape of a parallelogram (square, herein) consisting of several tens of turns. On the same side of the plane coil, under the plane coil in this drawing, four pairs of magneto resistive elements 2, 3, 4, and 5 are provided in a plane parallel to the plane coil. The magneto resistive element pairs 2, 3, 4, and 5 are constituted by two magneto resistive elements 21 and 22, 31 and 32, 41 and 42, and 51 and 52, respectively.

The term of "magneto resistive thin film" is used herein to describe the present invention. This refers to a thin film or thin plate that is a quite thin member made of metal, alloy, or compound having a magneto-resistance property. Typically, it has a thickness on the order of several tens of nanometers and a width of several micrometers to several hundreds micrometers. A current is passed therethrough in a longitudinal direction thereof. The magneto resistive thin films used in the respective EXAMPLES of the present invention are zigzag-shaped or meander-shaped.

The longitudinal direction of the magneto resistive thin plate 21, which is one of the magneto resistive element pair 2, crosses only one side 11 of the plane coil 1 at an angle of more than 30 degrees and less than 90 degrees, preferably no less than 45 degrees and less than 90 degrees, and specifically about 45 degrees in this EXAMPLE. The longitudinal direction of the magneto resistive thin plate 22, which is the other of the magneto resistive element pair 2, crosses only the opposed side, that is, a side 12 of the opposed conductor sides of the plane coil 1 at an angle of more than 30 degrees and less than 90 degrees, preferably no less than 45 degrees and less than 90 degrees, and specifically about 45 degrees in this EXAMPLE. The longitudinal direction of the magneto resistive thin plate 21 is not parallel to the longitudinal direction of the magneto resistive thin plate 22, in particular, is substantially perpendicular thereto in this EXAMPLE, and each of these magneto resistive thin plates 21 and 22 is connected to the other at one terminal thereof (a terminal on the inner side of the plane coil 1 in this EXAMPLE). Similarly, as for the other magneto resistive element pairs 3, 4, and 5, the longitudinal directions of the magneto resistive thin plates 31, 41, and 51 cross only the sides 12, 13, and 14, respectively, each of which is one side of the plane coil 1, and the longitudinal directions of the magneto resistive thin plates 32, 42, and 52 cross only the opposed sides 11, 14, and 13 of the plane coil 1, respectively, at an angle of more than 30 degrees and less than 90 degrees, preferably no less than 45 degrees and less than 90 degrees, and specifically about 45 degrees in this EXAMPLE. In addition, the longitudinal directions of the magneto resistive thin plates 31, 41, and 51 are not parallel to the longitudinal directions of their respective associated magneto resistive thin plates 32, 42, and 52, in particular, are perpendicular thereto in this EXAMPLE. And, each of the magneto resistive thin plates 31 and 32 is connected to the other at one terminal thereof (a terminal on the inner side of the plane coil 1 in this EXAMPLE), each of the magneto resistive thin plates 41 and 42 is connected to the other at one terminal thereof (a terminal on the inner side of the plane coil 1 in this EXAMPLE), and each of the magneto resistive thin plates 51 and 52 is connected to the other at one terminal thereof (a terminal on the inner side of the plane coil 1 in this EXAMPLE). Furthermore, the longitudinal directions of the two magneto resistive thin plates 21 and 32 both crossing the side 11 of the plane coil 1 are not parallel to each other, in particular, are perpendicular to each other in this EXAMPLE. Similarly, the longitudinal directions of the two magneto resistive thin plates 22 and 31 both crossing the side 12, the longitudinal directions of the two magneto resistive thin plates 41 and 52 both crossing the side 13, and the longitudinal directions of the two magneto resistive thin plates 42 and 51 both crossing the side 14 are not parallel to one another, and in particular perpendicular to one another in this EXAMPLE.

In this bearing sensor, the magneto resistive thin plates are provided on a substrate and further the plane coil is provided. The substrate is 0.7 mm thick. The thin film portion including the magneto resistive thin plates and plane coil disposed on the substrate is 40 to 50 micrometers thick. The substrate has a size of 3 mm×4 mm.

Figure 2:
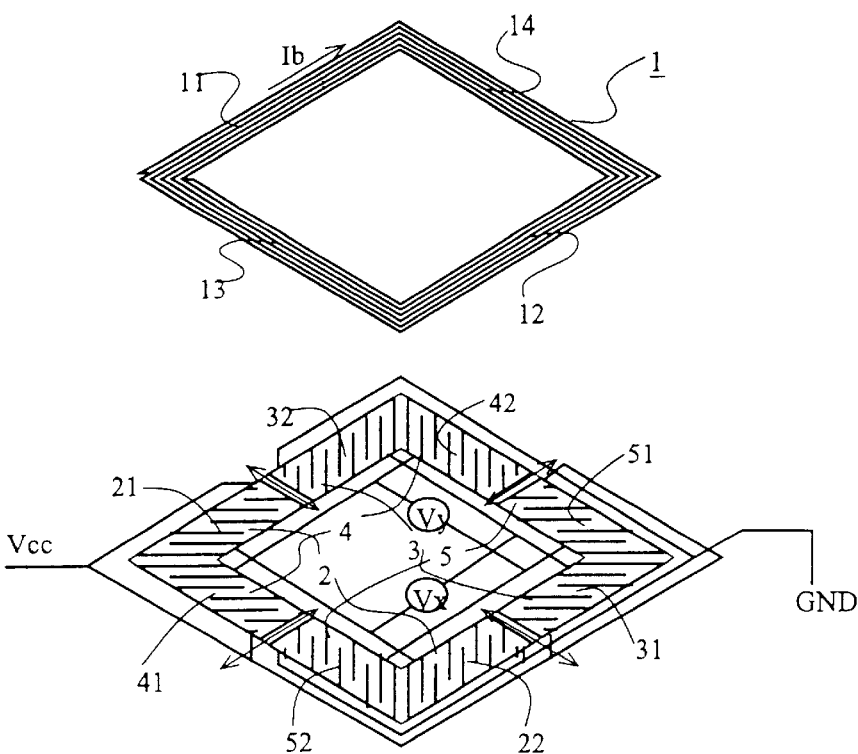
FIG. 2 is an exploded perspective view of the bearing sensor of EXAMPLE 1 of the present invention.
Figure 3:
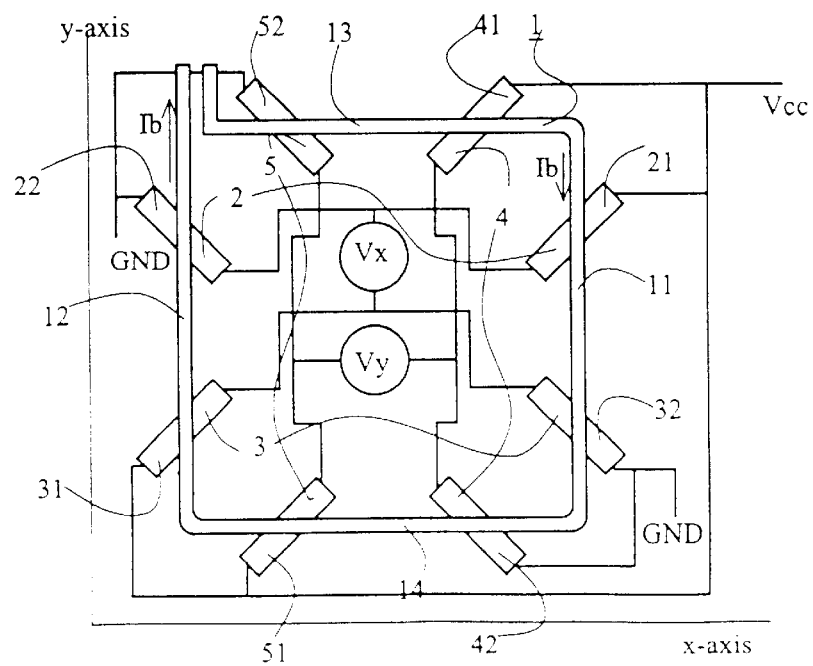
FIG. 3 is a circuit diagram of the bearing sensor of EXAMPLE 1 of the present invention.

For a better understanding of EXAMPLE 1 of the bearing sensor shown in FIG. 1, FIG. 2 is a schematic exploded perspective view thereof, and FIG. 3 is a circuit diagram thereof. As seen from FIG. 2, when a direct current is passed through the plane coil 1, a DC magnetic field is generated in a direction from the inside to the outside of the coil or vice versa in a plane parallel to the plane coil, so that the DC magnetic field is applied to the magneto resistive element pairs. With reference to FIG. 3, when a current Ib passes through the plane coil 1 in a clockwise direction, a magnetic field in x direction is applied to the magneto resistive thin plates 21 and 32, a magnetic field in the −x direction is applied to the magneto resistive thin plates 22 and 31, a magnetic field in the y direction is applied to the magneto resistive thin plates 41 and 52, and a magnetic field in the −y direction is applied to the magneto resistive thin plates 42 and 51. If a current −Ib passes through the plane coil 1 in the opposite direction, a magnetic field in the opposite direction is applied to each of the magneto resistive thin plates.

Figure 24:
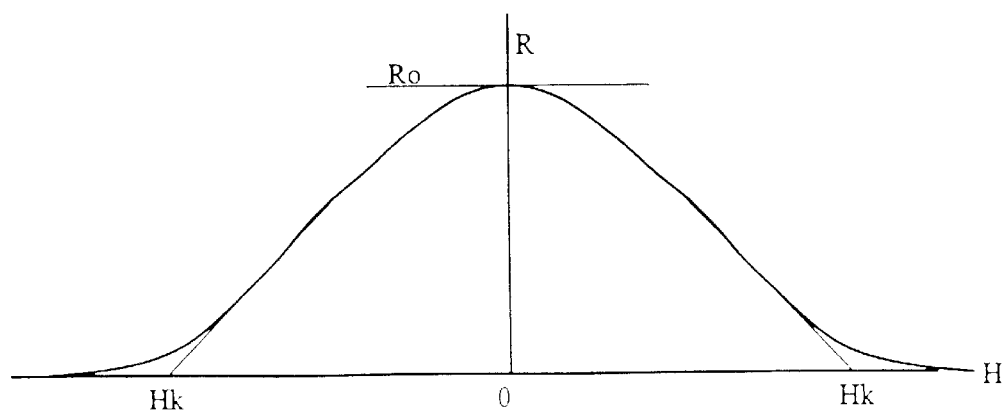
FIG. 24 is a typical graph showing a relationship between a resistance and an applied magnetic field strength.
Figure 25:
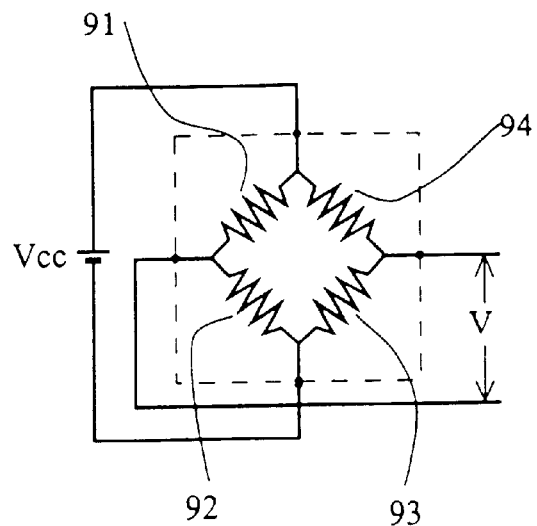
FIG. 25 is a circuit diagram of a typical bearing sensor.
Figure 26:
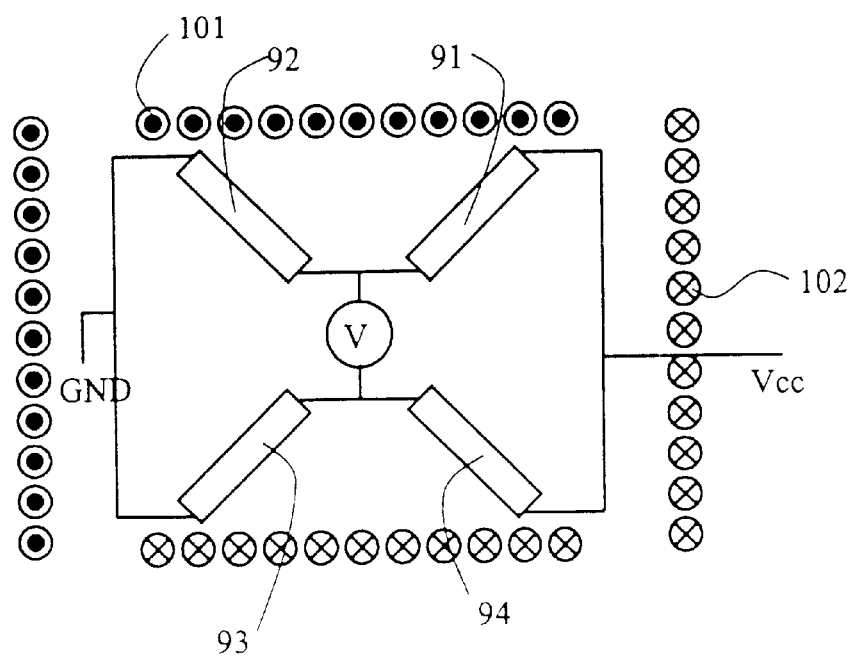
FIG. 26 is a schematic cross-sectional view of a conventional bearing sensor.
Figure 27:
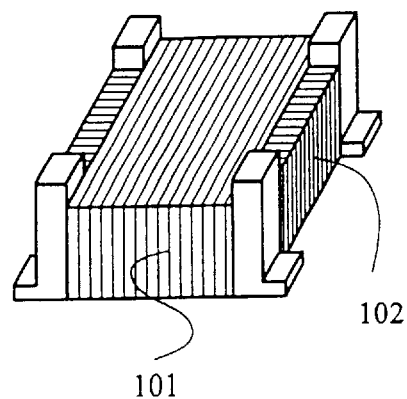
FIG. 27 is a perspective view of a conventional bearing sensor.
Figure 28:
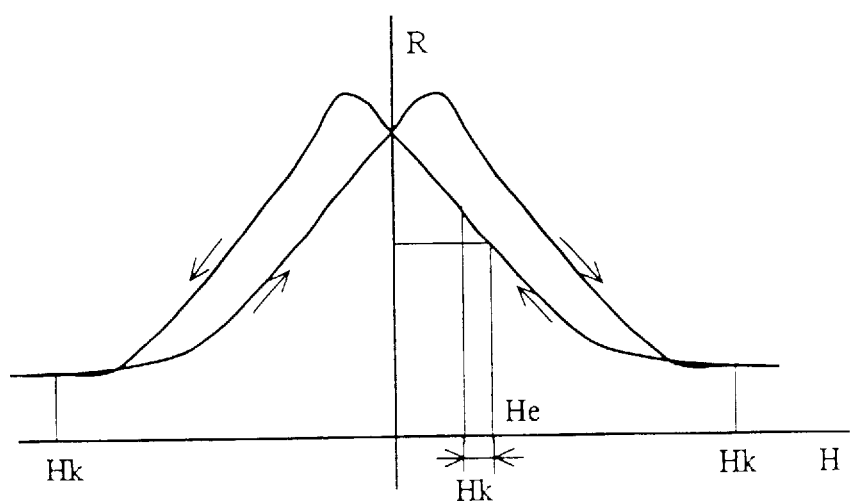
FIG. 28 is a graph showing a hysteresis involved in the relationship between the resistance and the applied magnetic field strength.

If, when a current is passed through a magneto resistive thin plate in the longitudinal direction, a magnetic field is applied in a direction perpendicular to the longitudinal direction in the magneto resistive element plane, the resistance of the magneto resistive thin plate is decreased depending on the magnetic field strength as shown in FIG. 24 and has a hysteresis depending on the direction of the applied magnetic field as shown in FIG. 28.

Figure 4:
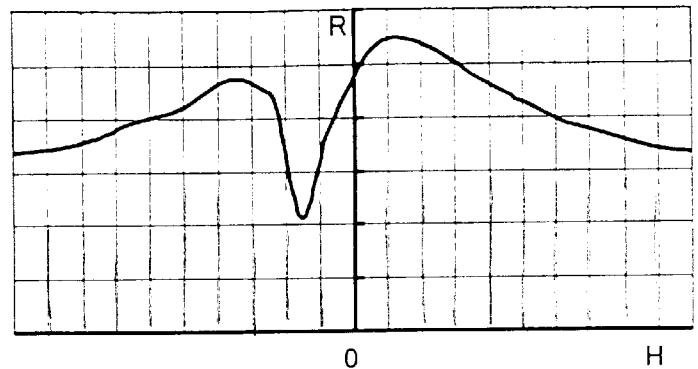
FIG. 4 is a graph showing a relationship between a resistance and an applied magnetic field strength.

If the magneto resistive thin plate crosses the side of the plane coil at an angle of 30 degrees to 90 degrees as in the present invention, the external magnetic field is applied in a direction of 30 degrees to 90 degrees with respect to a direction perpendicular to the longitudinal direction. At this time, the magneto resistive thin plate has a magnetic shape anisotropy in the longitudinal direction, so that this situation can be considered to be equivalent to the situation in which a synthetic vector of the magnetic shape anisotropy magnetic field and the external magnetic field is applied thereto. Therefore, the relationship between the external magnetic field and the resistance when the external magnetic field is applied to the magneto resistive thin plate is represented by the graph shown in FIG. 4. FIG. 4 shows the variation in the resistance in the case where while a strong magnetic field is applied in a positive direction, the strength of the applied magnetic field is gradually reduced. Since the resistance has the minimum value while the applied magnetic field is negative, when a negative magnetic field of a predetermined strength is applied, the variation ratio of the resistance with respect to the variation in the applied magnetic field becomes the largest. In the case where while the strong magnetic field is applied in the negative direction, the applied magnetic field is gradually increased, the graph representing the relationship between the resistance and the magnetic field is symmetrical to the graph shown in FIG. 4 with respect to a line of magnetic field of 0.

Therefore, in the present invention, when measuring bearings by using the bearing sensor of EXAMPLE 1 shown in FIGS. 1 through 3, a direct current is passed through the plane coil 1 in the clockwise direction in FIG. 3 to apply to the magneto resistive thin plates 21 to 52 a DC magnetic field enough to saturate a magnetic field of each of the magneto resistive thin plates 21 to 52 at least in the longitudinal direction, and a direct current of a predetermined strength is passed through the plane coil 1 in the opposite direction (counterclockwise direction in FIG. 3) to apply to the magneto resistive thin plates a biasing DC magnetic field in a direction perpendicular to the longitudinal direction, and during the application of the biasing DC magnetic field, a voltage Vcc for measuring bearings is applied between the other terminals of the magneto resistive thin plates of the magneto resistive element pairs to take out an intermediate potential from the connected terminals of the magneto resistive element pairs. When the direct current is passed in the clockwise direction in FIG. 3 to apply to the magneto resistive thin plates 21 to 52 the DC magnetic field enough to saturate the magnetic field of each of the magneto resistive thin plates 21 to 52 at least in the longitudinal direction, all of the magneto resistive thin plates enter a state shown in the right end of FIG. 4. The direct current is reduced or turned off, and a DC magnetic field caused by a direct current of a predetermined strength in a direction opposite to the direct current, in particular, counterclockwise direction in FIG. 3, that is, a magnetic field of a magnitude at which the variation ratio of the resistance with respect to the applied magnetic field approaches its maximum value is applied to take out an intermediate potential from the connected terminals of the magneto resistive thin plates. Now, it is assumed that the magnitude of the horizontal component of the earth magnetism is denoted by He, and the angle of the horizontal component of the earth magnetism He with respect to x axis is denoted by $\theta$. Then, the intermediate potential output of the magneto resistive thin plates 21 and 22 is represented by:

$$Vcc \cdot (1/2 - 1/(2 \cdot Rb) \cdot \beta He \cos \theta),$$

where reference symbol $\beta$ denotes a variation ratio of the resistance with respect to a magnetic field, and reference symbol Rb denotes a resistance of the magneto resistive thin plate at the time when only the biasing magnetic field Hb is applied.

In this EXAMPLE, since the difference between the intermediate potential outputs of the connected terminals of the magneto resistive element pairs 2 and 3 is taken out as Vx in FIG. 3, the intermediate potential output difference Vx is represented by:

$$Vx(+) = Vcc \cdot ((1/2 - 1/(2 \cdot Rb) \cdot \beta He \cos \theta) - (1/2 + 1/(2 \cdot Rb) \cdot \beta He \cos \theta)) = -Vcc \cdot 1/Rb \cdot \beta He \cos \theta.$$

Similarly, since the difference between the intermediate potential outputs of the connected terminals of the magneto resistive element pairs 4 and 5 is taken out as Vy in FIG. 3, the intermediate potential output difference Vy is represented by:

$$Vy(+) = Vcc \cdot ((1/2 - 1/(2 \cdot Rb) \cdot \beta He \sin \theta) - (1/2 + 1/(2 \cdot Rb) \cdot He \sin \theta)) = -Vcc \cdot 1/Rb \cdot \beta He \sin \theta.$$

Next, a direct current is passed through the plane coil 1 in a direction opposite to that of the above description (counterclockwise direction in FIG. 3) to apply to the magneto resistive thin plates 21 to 52 a DC magnetic field enough to saturate a magnetic field of each of the magneto resistive thin plates 21 to 52 at least in the longitudinal direction, and a direct current of a predetermined strength is passed through the plane coil 1 in a direction opposite to the former direct current (clockwise direction in FIG. 3) to apply to the magneto resistive thin plates a biasing DC magnetic field in a direction perpendicular to the longitudinal direction, and during the application of the biasing DC magnetic field, a voltage Vcc for measuring bearings is applied between the other terminals of the magneto resistive thin plates of the magneto resistive element pairs in the same manner as described above to take out an intermediate potential from the connected terminals. Provided that the absolute value of the magnitude of the applied magnetic field is substantially the same as that of the above description, the variation ratio of the resistance with respect to the applied magnetic field becomes maximum.

The difference between the intermediate potential outputs of the connected portions of the magneto resistive element pairs 2 and 3 is taken out as Vx in FIG. 3, the intermediate potential output difference Vx being represented by:

$$Vx(-) = Vcc \cdot 1/Rb \cdot \beta He \cos \theta.$$

And, the difference between the intermediate potential outputs of the connected terminals of the magneto resistive element pairs 4 and 5 is taken out as Vy in FIG. 3, the intermediate potential output difference Vy being represented by:

$$Vy(-) = Vcc \cdot 1/Rb \cdot \beta He \sin \theta.$$

The differences between the intermediate potential output differences in x direction and y direction are obtained as follows:

$$V \text{ in } x \text{ direction} = Vx(+) - Vx(-) = -2Vcc \cdot 1/Rb \cdot \beta He \cos \theta;$$

$$V \text{ in } y \text{ direction} = Vy(+) - Vy(-) = -2Vcc \cdot 1/Rb \cdot \beta He \sin \theta.$$

Therefore, the angle $\theta$ of the horizontal component of the earth magnetism with respect to x axis can be represented by:

$$\theta = a \tan(V \text{ in } y \text{ direction}/V \text{ in } x \text{ direction}).$$

As apparent from the above description, when a direct current is passed in one direction, the intermediate potential output differences at the time of applications of the biasing magnetic field to the magneto resistive element pairs 2, 3 and the magneto resistive element pairs 4, 5 in x direction and y direction, respectively, can be obtained simultaneously, and when a direct current is passed in the opposite direction, the intermediate potential output differences at the time of applications of the biasing magnetic field to the magneto resistive element pairs 2, 3 and the magneto resistive element pairs 4, 5 in −x direction and −y direction, respectively, can be obtained simultaneously.

Figure 5:
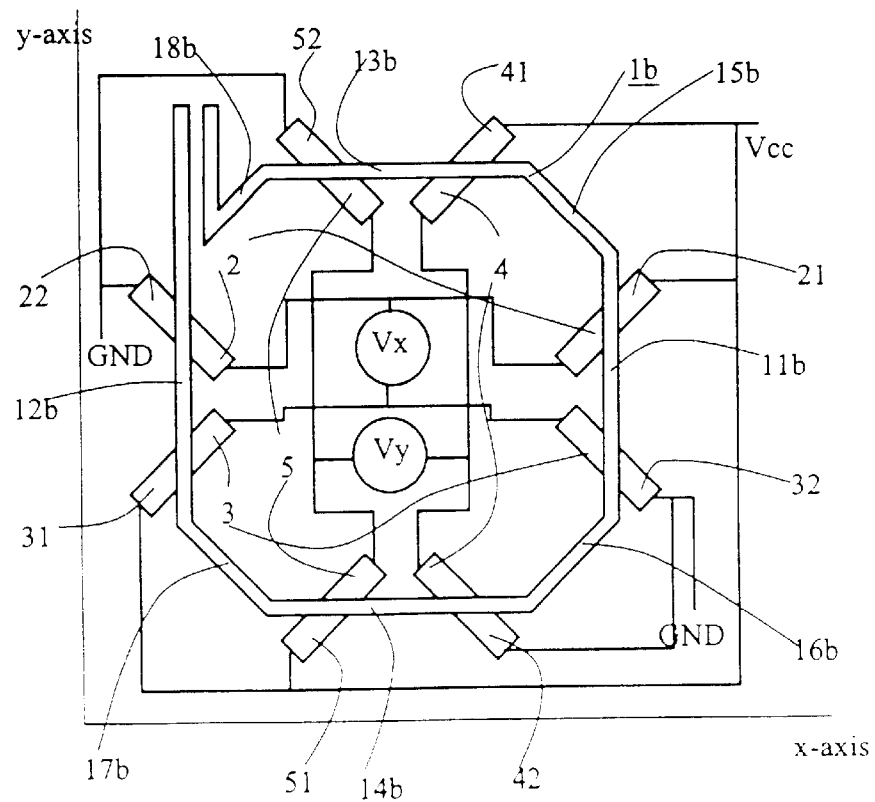
FIG. 5 is a circuit diagram of a bearing sensor utilizing a modification of a plane coil.
Figure 6:
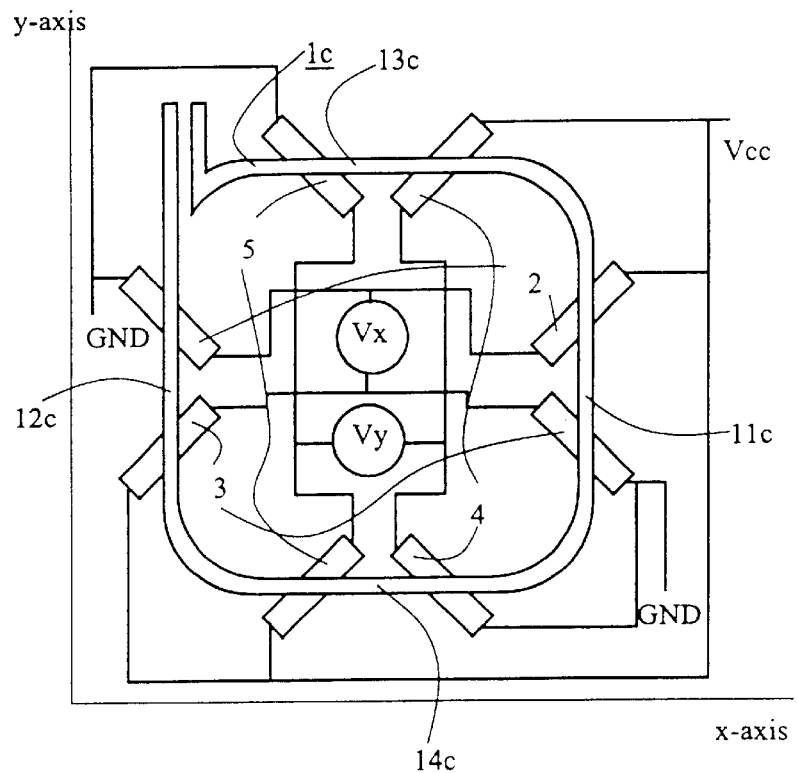
FIG. 6 is a circuit diagram of a bearing sensor utilizing another modification of a plane coil.

While in EXAMPLE 1 described above, the plane coil of a shape of a parallelogram is used for explanation, the plane coils shown in the perspective plan views of FIGS. 5 and 6 may be used. A plane coil 1b shown in FIG. 5 has two pairs of opposed conductor sides parallel to each other, in which sides 11b and 12b of the plane coil 1b are parallel to each other and sides 13b and 14b are parallel to each other. There is an oblique coil section 15b between the sides 11b and 13b, there is an oblique coil section 16b between the sides 11b and 14b, there is an oblique coil section 17b between the sides 14b and 12b, and there is an oblique coil section 18b between the sides 12b and 13. The four sides 11b, 12b, 13b, and 14b partially constitute four sides of a rectangle, or square herein. As in the case of FIG. 3, the longitudinal directions of the magneto resistive element pairs 2 and 3 cross the sides 11b and 12b constituting one parallel opposed conductor side pair at an angle of about 45 degrees. Similarly, the longitudinal directions of the magneto resistive element pairs 4 and 5 cross the sides 13b and 14b constituting one parallel opposed conductor side pair at an angle of about 45 degrees. Since the plane coil is linear at points where it crosses the magneto resistive thin plates, in the case where the magneto resistive element surface is located under the coil surface, when a current is passed through the coil 1b in the clockwise direction, a magnetic field in an outward direction can be applied to all the magneto resistive thin plates at an angle of 45 degrees with respect to their respective longitudinal directions. Therefore, the plane coil shown in FIG. 5 can be used in the bearing sensor in the entirely same manner as described above.

A plane coil 1c shown in FIG. 6 also has two pairs of opposed conductor sides parallel to each other. Sides 11c and 12c are parallel to each other and sides 13c and 14c are parallel to each other. There are curved coil sections between the parallel linear sides, in which the four sides 11c, 12c, 13c, and 14c partially constitute four sides of a rectangle, or square herein. The longitudinal directions of the magneto resistive thin plates cross the respective sides constituting the parallel opposed conductor side pairs at an angle of about 45 degrees. The plane coil 1c is linear at points where it crosses the magneto resistive thin plates, and thus, it will be understood that this plane coil 1c can also be used in the bearing sensor.

EXAMPLE 2

Figure 7:
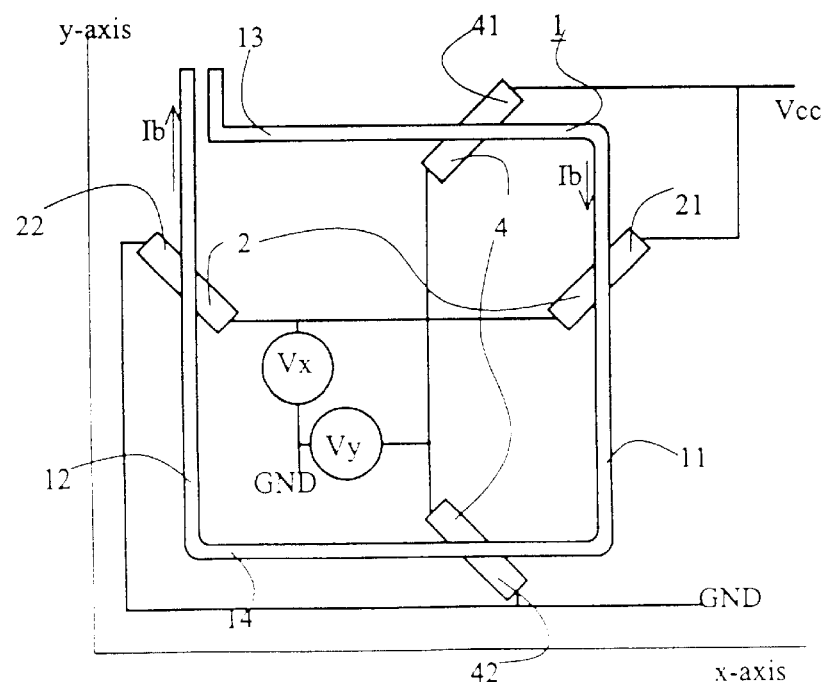
FIG. 7 is a circuit diagram of the bearing sensor of EXAMPLE 2 of the present invention.

FIG. 7 is a circuit diagram of a bearing sensor of EXAMPLE 2 of the present invention. The bearing sensor shown in this drawing is a bearing sensor provided by removing the magneto resistive element pairs 3 and 5 from the bearing sensor shown in the circuit diagram of FIG. 3. Therefore, while the intermediate potential output differences between the magneto resistive element pairs 2 and 3 and between the magneto resistive element pairs 4 and 5 are obtained in the case of the bearing sensor of FIG. 3, the intermediate potential output of each of the magneto resistive element pairs 2 and 4 is obtained in the case of the bearing sensor of FIG. 7. The reference numerals are the same as in FIGS. 1 through 3.

The intermediate potential output of the magneto resistive element pair 2 at the time of application of a predetermined biasing magnetic field in one direction is as follows:

$$Vx(+)=Vcc\cdot(1/2-1/(2\cdot Rb)\cdot \beta He \cos \theta), \text{ and}$$

the intermediate potential output at the time of application of a predetermined DC magnetic field in the other direction is as follows:

$$Vx(-)=Vcc\cdot(1/2+1/(2\cdot Rb)\cdot \beta He \cos \theta).$$

Furthermore, the intermediate potential output of the magneto resistive element pair 4 at the time of application of a predetermined biasing magnetic field in one direction is as follows:

$$Vy(+)=Vcc\cdot(1/2-1/(2\cdot Rb)\cdot \beta He \sin \theta), \text{ and}$$

the intermediate potential output at the time of application of a predetermined DC magnetic field in the other direction is as follows:

$$Vy(-)=Vcc\cdot(1/2+1/(2\cdot Rb)\cdot \beta He \sin \theta).$$

Therefore, the differences between the intermediate potential outputs in x direction and y direction are obtained as follows:

$$V \text{ in } x \text{ direction}=Vx(+)-Vx(-)=-Vcc\cdot 1/Rb\cdot \beta He \cos \theta; \text{ and}$$

$$V \text{ in } y \text{ direction}=Vy(+)-Vy(-)=-Vcc\cdot 1/Rb\cdot \beta He \sin \theta.$$

These outputs are half the respective outputs of EXAMPLE 1. This is because while the full bridge is used in the EXAMPLE 1, a half bridge is used in this EXAMPLE. The angle θ of the horizontal component of the earth magnetism with respect to x axis can be obtained as follows:

$$\theta=a \tan(V \text{ in } y \text{ direction}/V \text{ in } x \text{ direction}).$$

As apparent from the above description, in this EXAMPLE, when a direct current is passed in one direction, the intermediate potential outputs at the time of applications of the biasing magnetic field to the magneto resistive element pairs 2 and 4 in x direction and y direction, respectively, can be obtained simultaneously. In addition, when a direct current is passed in the opposite direction, the intermediate potential outputs at the time of applications of the biasing magnetic field to the magneto resistive element pairs 2 and 4 in −x direction and −y direction, respectively, can be obtained simultaneously.

EXAMPLE 3

Figure 8:
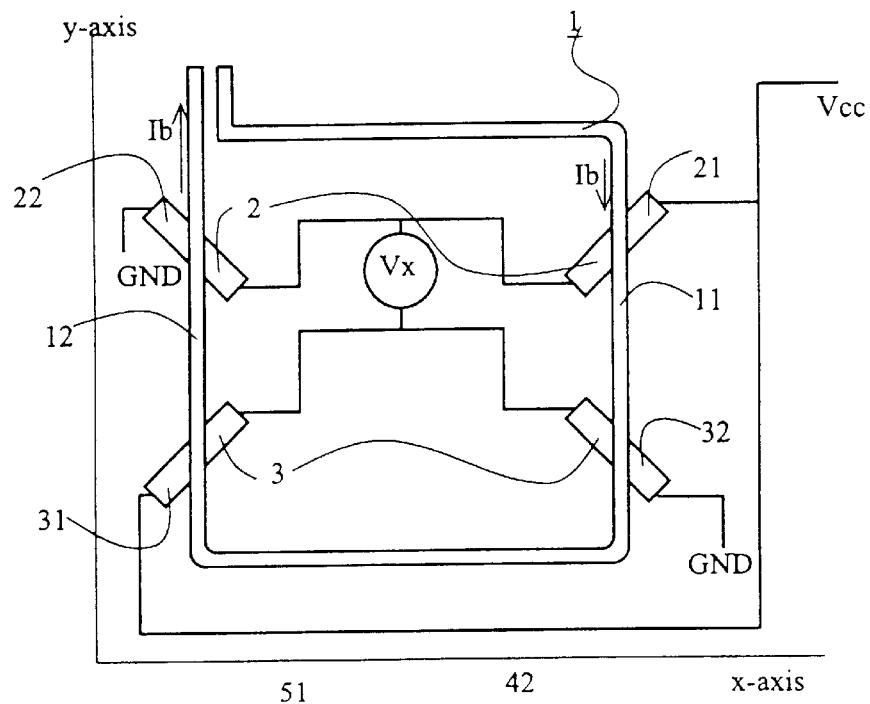
FIG. 8 is a circuit diagram of the bearing sensor of EXAMPLE 3 of the present invention.

FIG. 8 is a circuit diagram of a bearing sensor of EXAMPLE 3 of the present invention. The bearing sensor shown in this drawing is a bearing sensor provided by removing the magneto resistive element pairs 4 and 5 from the bearing sensor shown in the circuit diagram of FIG. 3. In this EXAMPLE, the intermediate potential output differences between the magneto resistive element pairs 2 and 3 are obtained. The reference numerals are the same as in FIGS. 1 to 3 and 7.

As in the case of EXAMPLE 1, the intermediate potential output difference between the magneto resistive element pairs 2 and 3 when a current is passed therethrough in one direction to apply a predetermined magnetic field is as follows:

$$Vx(+)=-Vcc\cdot 1/(2\cdot Rb)\cdot \beta He \cos \theta, \text{ and}$$

the intermediate potential output difference between the magneto resistive element pairs 2 and 3 when a current is passed therethrough in the opposite direction to apply a predetermined magnetic field is similarly as follows:

$$Vx(-)=Vcc\cdot 1/(2\cdot Rb)\cdot \beta He \cos \theta.$$

Thus, the difference between the intermediate potential output differences at the time of applications of the magnetic fields in both the directions is obtained as follows:

$$V \text{ in } x \text{ direction}=Vx(+)-Vx(-)=-Vcc\cdot 1/Rb\cdot \beta He \cos \theta.$$

From this formula, the angle θ of the horizontal component of the earth magnetism with respect to x axis can be obtained. However, since the output difference V in y direction is not measured, it cannot be determined whether the sign of the angle θ is plus or minus. In addition, since the angle θ is a function of the voltage Vcc, a constant current circuit is required.

EXAMPLE 4

Figure 9:
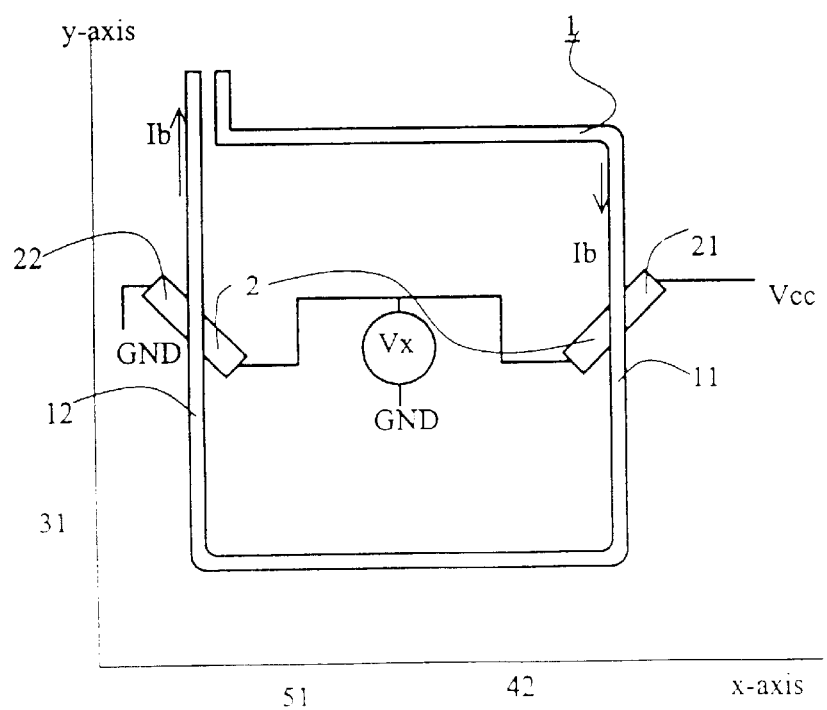
FIG. 9 is a circuit diagram of the bearing sensor of EXAMPLE 4 of the present invention.

FIG. 9 is a circuit diagram of a bearing sensor of EXAMPLE 4 of the present invention. This bearing sensor shown in this drawing is a bearing sensor provided by further removing the magneto resistive element pair 3 from the bearing sensor shown in FIG. 8. In this EXAMPLE, the intermediate potential output of the magneto resistive element pair 2 is obtained. The reference numerals are the same as in FIGS. 1 to 3, and 7 and 8.

As in the case of EXAMPLE 2, the intermediate potential output of the magneto resistive element pair 2 when a current is passed therethrough in one direction to apply a predetermined magnetic field is as follows:

$$Vx(+)=Vcc\cdot (1/2-1/(2\cdot Rb))\cdot \beta He \cos \theta, \text{ and}$$

the intermediate potential output of the magneto resistive element pair 2 when a current is passed therethrough in the opposite direction to apply a predetermined magnetic field is similarly as follows:

$$Vx(-)=Vcc\cdot (1/2+1/(2\cdot Rb))\cdot \beta He \cos \theta).$$

Thus, the difference between the intermediate potential outputs at the time of applications of the magnetic fields in both the directions is obtained as follows:

$$V \text{ in } x \text{ direction}=Vx(+)-Vx(-)=-Vcc\cdot 1/Rb\cdot \beta He \cos \theta.$$

From this formula, the angle θ of the horizontal component of the earth magnetism with respect to x axis can be obtained. In this case also, however, since the output difference V in y direction is not measured, it cannot be determined whether the sign of the angle θ is plus or minus. In addition, since the angle θ is a function of the voltage Vcc, a constant current circuit is required.

While in the description of EXAMPLES 1 through 4, the angle at which the magneto resistive thin plates cross the respective sides of the plane coil is assumed to be π/4, that is, 45 degrees, bearings can be measured as far as the angle is more than 30 degrees and less than 90 degrees. Specifically, it is preferred that the angle is no less than 45 degrees and less than 90 degrees because the resistance varies significantly according to the magnetic field within the range of angle. However, when the angle is too large, the region in which the resistance varies according to the magnetic field is reduced in the vicinity of the minimum value in FIG. 4 so that it is difficult to establish an appropriate biasing magnetic field. Therefore, the most manageable angle is 45 degrees.

Furthermore, while in the above EXAMPLES, the cases has been described in which the longitudinal directions of the two magneto resistive thin plates crossing one side of the plane coil 1 are perpendicular to each other, and the longitudinal directions of the two magneto resistive thin plates of one magneto resistive element pair are perpendicular to each other, it is only needed that they are not parallel to each other. However, the most manageable angle thereof is a right angle. It is preferred that the angles at which the magneto resistive thin plates in one element pair cross the respective sides is in a mirror relationship (mirror image). If one crosses the side at 10 degrees, and the other crosses the side at 60 degrees, the output of the bridge circuit is varied. As the relationship approximates the mirror relationship, the output is less varied and approximates a sine wave. Therefore, in the magneto resistive element pair, the difference between the angles at which the magneto resistive thin plates cross the respective sides falls within the range of +/−5 degrees. More preferably, for all the magneto resistive thin plates in the bearing sensor, the variation in the angles at which the magneto resistive thin plates cross the respective sides falls within the range of +/−5 degrees.

The bearing sensor described in EXAMPLE 1 was manufactured by way of experiment. The bearing sensors having the magneto resistive thin plates of 30 nm thick and of 31.5 nm thick were manufactured. The magneto resistive thin plates of 30 nm thick is less affected by the demagnetizing field, and if the thickness is increased, the apparent demagnetizing field is increased, so that it becomes required to increase the coil current in order to apply a required saturation magnetic field and biasing magnetic field. Furthermore, if the plates are too thin, the resistivity variation ratio can be reduced, so that the adequate thickness is 30 nm +/−5 nm.

The manufacturing was conducted by varying the width of the magneto resistive thin plate from 40 micrometers to 10 micrometers. The plate of 40 micrometers width is optimum because it is less affected by the demagnetizing field. If the width is larger than this, the number of foldings of the meander is reduced so that the resistance is reduced. If the resistance is low, power consumption is increased. The width is preferably 30 to 40 micrometers in order to maximize the number of foldings and reduce the affection of the demagnetizing field.

If the distance between the magneto resistive thin plates is equal to or less than 5 micrometers, a problem of a short-circuit arises. While widening the distance allows the problem to be eliminated, then the occupancy of the magneto resistive thin plate in the area of the magneto resistive thin plate is reduced. Therefore, the optimal distance is 5 micrometers.

As for the plane coil, when the plane coil having an outer diameter of 2 to 3 mm and the number of turns of 50 to 100 turns was manufactured, a sufficient output was obtained. The size of the coil is preferably as small as possible to minimize the power consumption.

The most effective way to generate a required magnetic field by a low power supply voltage is to reduce the resistance of the coil. The coil resistance depends on the thickness, width, and length, and the length dominantly depends on the size of the coil. While the width and thickness preferably are as large as possible, the thickness is defined by the space between the conductors. Within the restriction of the space between the conductors, the thickness is preferably large. In terms of manufacturing, however, it is not preferred that the plating thickness is too large. Therefore, the adequate thickness is 2 to 5 micrometers. Accordingly, the adequate width is 8 to 20 micrometers.

The distance between the plane coil and the magneto resistive thin plate is preferably as small as possible because the magnetic field in the vicinity of the pole of the plane coil is used in the present invention. It is suitable that the distance is on the order of 1.5 times the thickness of the magneto resistive thin plate and wiring film in consideration of the insulating property of the insulating film disposed therebetween. The adequate distance is 0.5 to 2 micrometers.

Figure 10A:
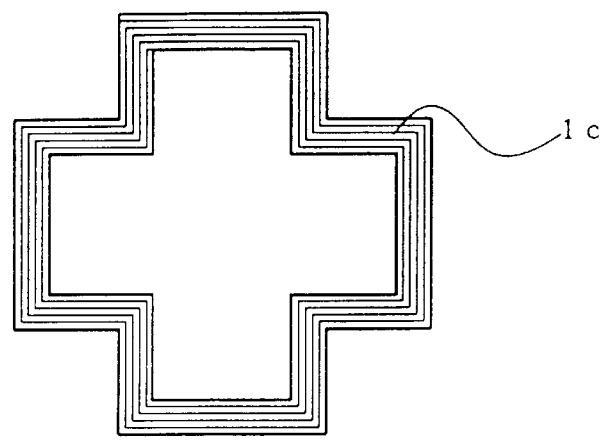
FIG. 10 is a schematic plan view showing other examples of the plane coil.
Figure 10B:
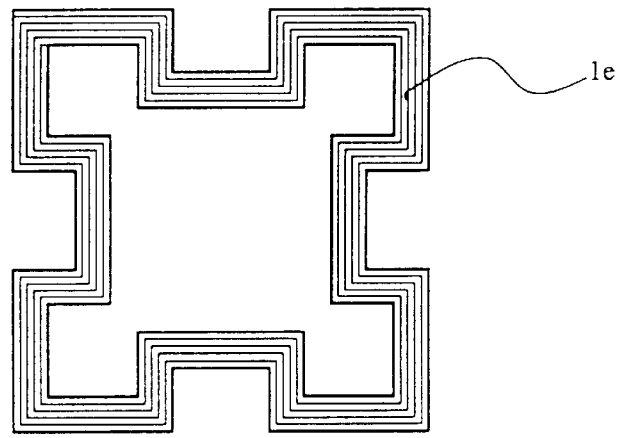
Figure 10C:
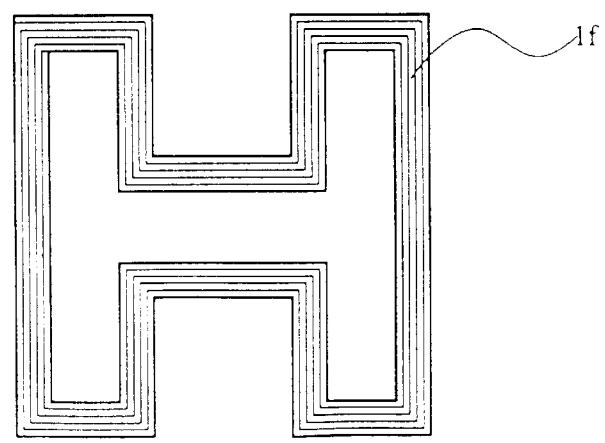

The present invention has been explained by using the plane coil of the shape of parallelogram or rectangle, in particular, square, in the above description. Now, the schematic plan views of the plane coils of other shapes are shown in FIGS. 10A to 10C. As a plane coil having an even number of sides, each of which is parallel to the opposed side, plane coils 10$d$, 10$e$, and 10$f$ shown in FIGS. 10A to 10C can be used. In EXAMPLES 5 through 8, the bearing sensor having the plane coil 10$d$ shown in FIG. 10A will be described.

EXAMPLE 5

Figure 11:
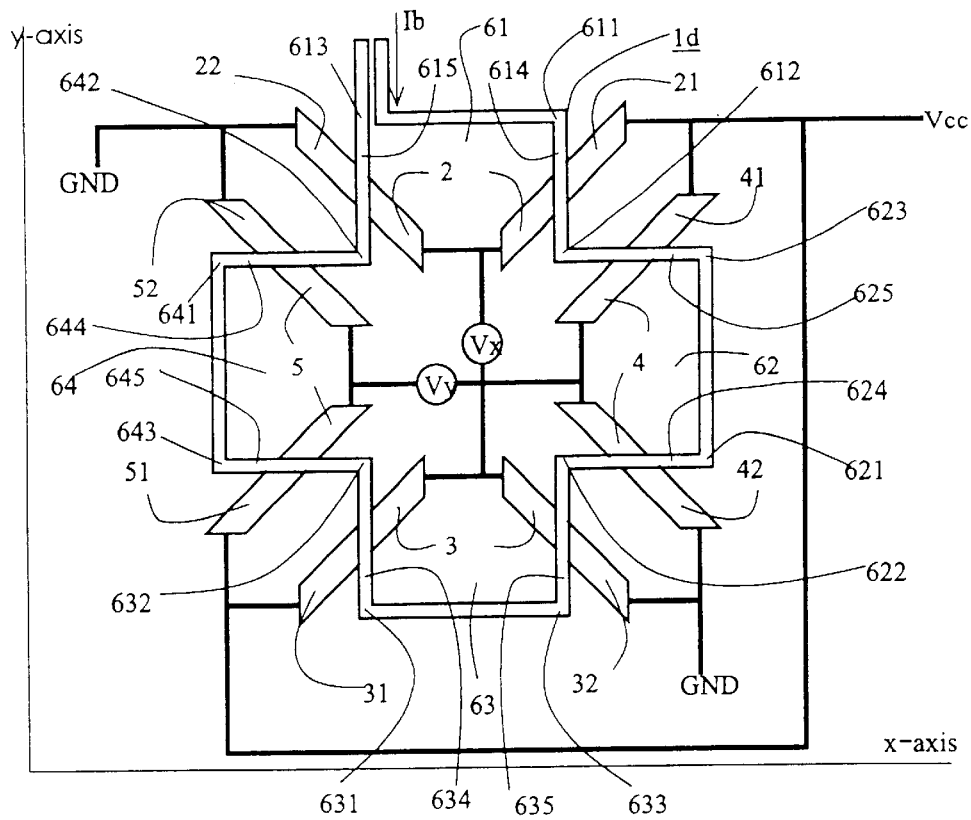
FIG. 11 is a circuit diagram of the bearing sensor of EXAMPLE 5 of the present invention.

FIG. 11 is a circuit diagram of a bearing sensor of EXAMPLE 5 of the present invention. In FIG. 11, reference numeral 1$d$ denotes a plane coil consisting several tens of turns that is arranged around an outer periphery of a cross-shaped plane. On the same side of the plane coil, that is, under the plane coil in this drawing, four magneto resistive element pairs 2, 3, 4, and 5 are provided in a plane parallel to the plane coil. Each of the magneto resistive element pairs 2, 3, 4, and 5 consists of two magneto resistive thin plates 21 and 22, 31 and 32, 41 and 42, and 51 and 52, respectively, and these magneto resistive thin plates are substantially the same as those shown in EXAMPLES 1 through 4. The plane coil 1$d$ has: opposed conductor sides 614 and 615, which are wires on both sides of a protrusion 61 of the cross-shaped plane, each between a top corner and a bottom corner of the protrusion of the cross-shaped plane, and parallel to each other, that is, which are sections between a top corner 611 and a bottom corner 612 and between a top corner 613 and a bottom corner 642, respectively, that are parallel to each other; opposed conductor sides 624 and 625, which are wires on both sides of a protrusion 62 of the cross-shaped plane, each between a top corner and a bottom corner of the protrusion of the cross-shaped plane, and parallel to each other, that is, which are sections between a top corner 621 and a bottom corner 622 and between a top corner 623 and a bottom corner 612, respectively, that are parallel to each other; opposed conductor sides 634 and 635, which are wires on both sides of a protrusion 63 of the cross-shaped plane, each between a top corner and a bottom corner of the protrusion of the cross-shaped plane, and parallel to each other, that is, which are sections between a top corner 631 and a bottom corner 632 and between a top corner 633 and a bottom corner 622, respectively, that are parallel to each other; and opposed conductor sides 644 and 645, which are wires on both sides of a protrusion 64 of the cross-shaped plane, each between a top corner and a bottom corner of the protrusion of the cross-shaped plane, and parallel to each other, that is, which are sections between a top corner 641 and a bottom corner 642 and between a top corner 643 and a bottom corner 632, respectively, that are parallel to each other.

The longitudinal direction of one magneto resistive thin plate 21 of the magneto resistive element pair 2 cross only one side 614 of the opposed conductor sides pair of the plane coil 1$d$ at an angle more than 30 degrees and less than 90 degrees, preferably no less than 45 degrees and less than 90 degrees, and specifically about 45 degrees in this EXAMPLE. The longitudinal direction of the other magneto resistive thin plate 22 of the magneto resistive element pair 2 cross only the opposed side, that is, the side 615 of the plane coil 1$d$ at an angle more than 30 degrees and less than 90 degrees, preferably no less than 45 degrees and less than 90 degrees, and specifically about 45 degrees in this EXAMPLE. The longitudinal direction of the magneto resistive thin plate 21 is not parallel to the longitudinal direction of the magneto resistive thin plate 22, in particular, perpendicular to each other in this EXAMPLE, and each of the magneto resistive thin plates 21 and 22 is connected to the other at one terminal thereof (a terminal on the inner side of the plane coil 1$d$ in this EXAMPLE). Similarly, as for the other magneto resistive element pairs 3, 4, and 5, the longitudinal directions of the magneto resistive thin plates 31, 41, and 51 cross only the sides 634, 625, and 645, respectively, each of which is one side of an opposed conductor side pair in the plane coil 1$d$, and the longitudinal directions of the magneto resistive thin plates 32, 42, and 52 cross only the respective opposed sides 635, 624, and 644 of the opposed conductor side pairs in the plane coil 1$d$, respectively, at an angle of more than 30 degrees and less than 90 degrees, preferably no less than 45 degrees and less than 90 degrees, and specifically about 45 degrees in this EXAMPLE. In addition, the longitudinal directions of the magneto resistive thin plates 31, 41, and 51 are not parallel to the longitudinal directions of their respective associated magneto resistive thin plates 32, 42, and 52, in particular, are perpendicular thereto in this EXAMPLE. And, each of the magneto resistive thin plates 31 and 32 is connected to the other at one terminal thereof (a terminal on the inner side of the plane coil 1$d$ in this EXAMPLE), each of the magneto resistive thin plates 41 and 42 is connected to the other at one terminal thereof (a terminal on the inner side of the plane coil 1$d$ in this EXAMPLE), and each of the magneto resistive thin plates 51 and 52 is connected to the other at one terminal thereof (a terminal on the inner side of the plane coil 1$d$ in this EXAMPLE). Furthermore, the longitudinal directions of the two magneto resistive thin plates 21 and 32 crossing the sides 614 and 635 of the plane coil 1, respectively, are not parallel to each other, in particular, are perpendicular to each other in this EXAMPLE. That is, the longitudinal directions of the two magneto resistive thin plates 21 and 32 crossing the coil sides 614 and 635 of the same orientation are not parallel to each other. Similarly, the longitudinal directions of the two magneto resistive thin plates 22 and 31 crossing the coil sides 615 and 634 of the same orientation, the longitudinal directions of the two magneto resistive thin plates 41 and 52 crossing the coil side 625 and 644 of the same orientation, and the longitudinal directions of the two magneto resistive thin plates 42 and 51 crossing the coil sides 624 and 645 of the same orientation are not parallel to one another, and in particular perpendicular to one another in this EXAMPLE.

In this bearing sensor, the magneto resistive thin plates are provided on a substrate and further the plane coil is provided. The substrate is 0.7 mm thick. The thin film portion including the magneto resistive thin plates and plane coil disposed on the substrate is 40 to 50 micrometers thick. The substrate has a size of 3 mm×4 mm.

When a direct current is passed through the plane coil 1$d$, a DC magnetic field is generated in a direction from the inside to the outside of the coil or vice versa in a plane parallel to the plane coil, so that the DC magnetic field is applied to the magneto resistive element pairs. When a current 1b passes through the plane coil 1d, which is shown as a coil of one turn in FIG. 11, in a clockwise direction, a magnetic field in x direction is applied to the magneto resistive thin plates 21 and 32, a magnetic field in the −x direction is applied to the magneto resistive thin plates 22 and 31, a magnetic field in the y direction is applied to the magneto resistive thin plates 41 and 52, and a magnetic field in the −y direction is applied to the magneto resistive thin plates 42 and 51. If a current −Ib passes through the plane coil 1d in the opposite direction, a magnetic field in the opposite direction is applied to each of the magneto resistive thin plates. Therefore, it will be understood that the bearing sensor of this EXAMPLE operates the same as the bearing sensor of EXAMPLE 1.

EXAMPLE 6

Figure 12:
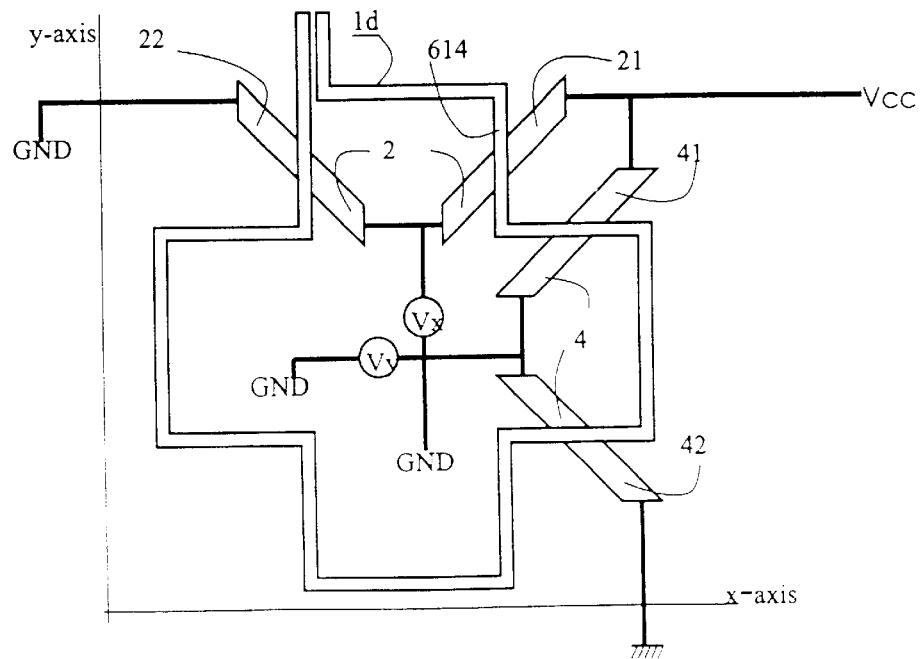
FIG. 12 is a circuit diagram of the bearing sensor of EXAMPLE 6 of the present invention.

FIG. 12 is a circuit diagram of a bearing sensor of EXAMPLE 6 of the present invention. The bearing sensor shown in this drawing is a bearing sensor provided by removing the magneto resistive element pairs 3 and 5 from the bearing sensor shown in the circuit diagram of FIG. 11. Therefore, while the intermediate potential output differences between the magneto resistive element pairs 2 and 3 and between the magneto resistive element pairs 4 and 5 are obtained in the case of the bearing sensor of FIG. 11, the intermediate potential output of each of the magneto resistive element pairs 2 and 4 is obtained in the case of the bearing sensor of FIG. 12. The reference numerals are the same as in FIG. 11. It will be understood that the bearing sensor of this EXAMPLE operates the same as the bearing sensor of EXAMPLE 2.

EXAMPLE 7

Figure 13:
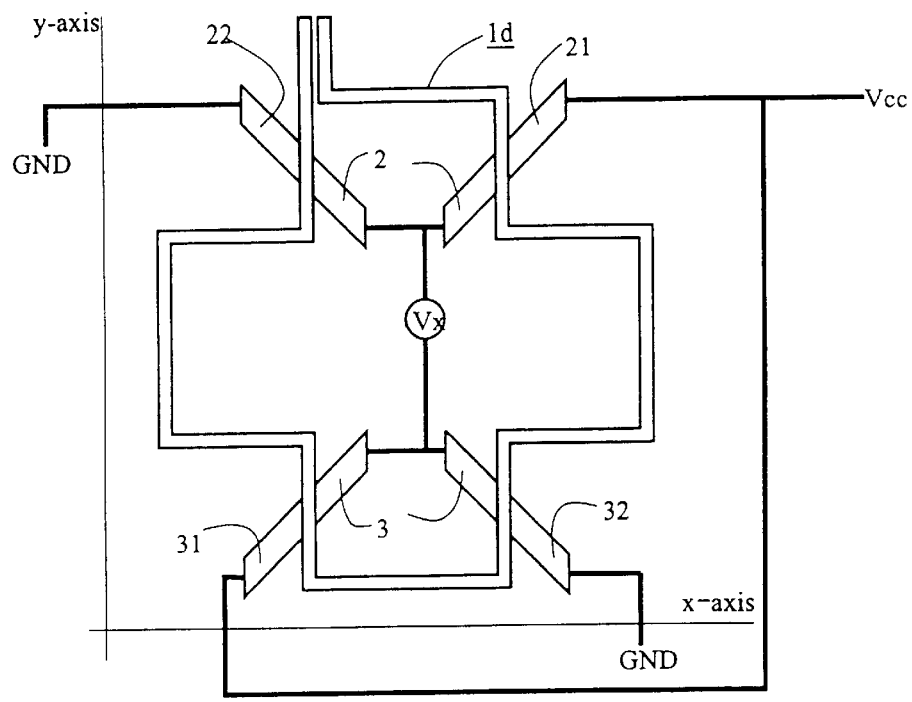
FIG. 13 is a circuit diagram of the bearing sensor of EXAMPLE 7 of the present invention.

FIG. 13 is a circuit diagram of a bearing sensor of EXAMPLE 7 of the present invention. The bearing sensor shown in this drawing is a bearing sensor provided by removing the magneto resistive element pairs 4 and 5 from the bearing sensor shown in the circuit diagram of FIG. 11. In this EXAMPLE, the intermediate potential output difference between the magneto resistive element pairs 2 and 3 are obtained. The reference numerals are the same as in FIG. 11. It will be understood that the bearing sensor of this EXAMPLE operates the same as the bearing sensor of EXAMPLE 3.

EXAMPLE 8

Figure 14:
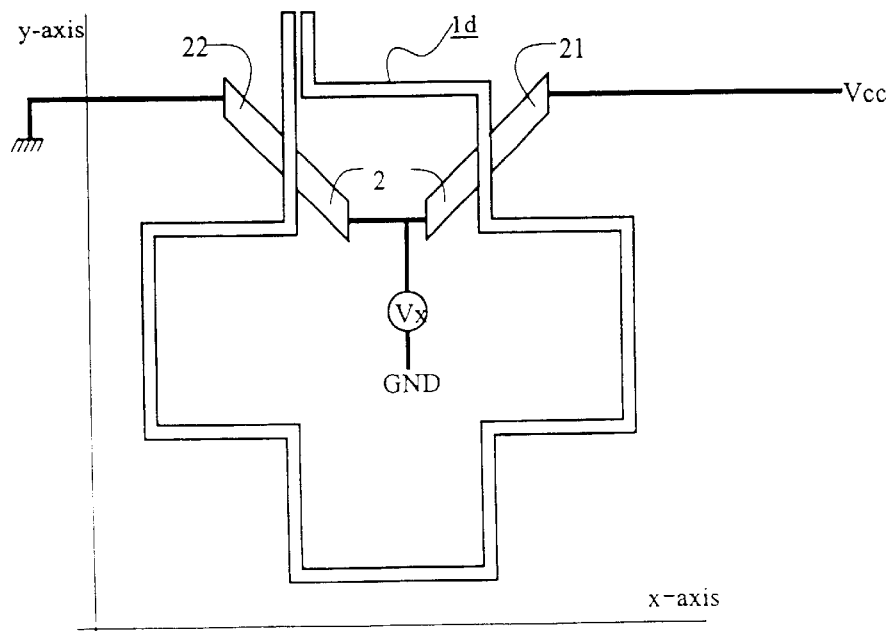
FIG. 14 is a circuit diagram of the bearing sensor of EXAMPLE 8 of the present invention.

FIG. 14 is a circuit diagram of a bearing sensor of EXAMPLE 8 of the present invention. This bearing sensor shown in this drawing is a bearing sensor provided by further removing the magneto resistive element pair 3 from the bearing sensor shown in FIG. 13. In this EXAMPLE, the intermediate potential output of the magneto resistive element pair 2 is obtained. The reference numerals are the same as in FIG. 13. It will be understood that the bearing sensor of this EXAMPLE operates the same as the bearing sensor of EXAMPLE 4.

Figure 15:
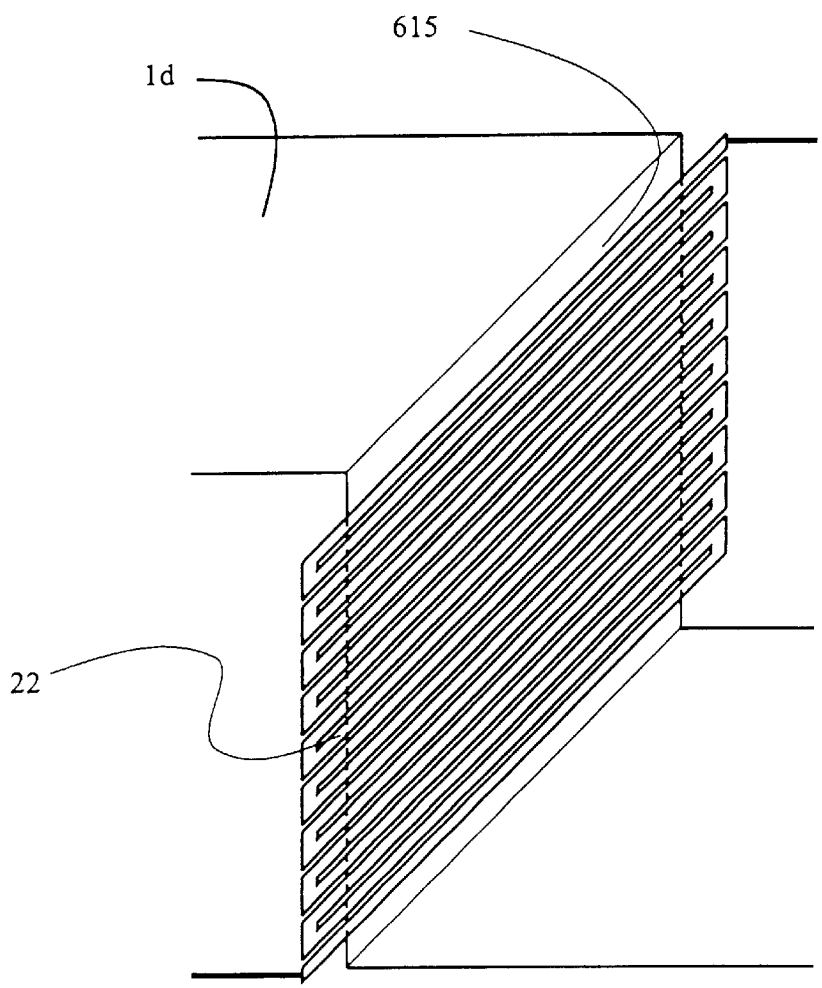
FIG. 15 is an enlarged bottom view of a magneto resistive thin plate used in EXAMPLES 5 through 8 of the present invention.

FIG. 15 is an enlarged bottom view showing the magneto resistive thin plate 22 of the bearing sensor of EXAMPLES 5 through 8 and one side 615 of the opposed conductor side pair of the plane coil 1d crossing the magneto resistive thin plate 22. As apparent from this drawing, the magnetic field application regions at the parallel sides of the opposed conductor side pair have a shape of parallelogram. Therefore, the lengths of the magneto resistive thin plates arranged so as to cross the coil sides can be uniform. The magnetic shape anisotropy of the magneto resistive thin plate depends on the ratio between the length and width, so that if the length can be uniform in this way, the same magnetic shape anisotropy can be obtained.

From the description of EXAMPLES 5 through 8, it has become apparent that the plane coil 1d shown in FIG. 10A can be used in the present invention. While EXAMPLES as for the plane coil 1e and 1f shown in FIGS. 10B and 10C, respectively, are omitted herein, it can be readily seen that the plane coil 1e and 1f also can be used in the present invention.

In the EXAMPLES described above, as shown in FIG. 2, the bearing sensor is of a two-layered type in which a magneto resistive thin plate is provided on a substrate and a coil is disposed thereon. The number of the magneto resistive thin plates or the coils may be increased. For example, if a three-layered type is provided in which a magneto resistive thin plate, a coil, and a magneto resistive thin plate are disposed on a substrate sequentially, the output can be doubled. Alternatively, a three-layered type in which a coil, a magneto resistive thin plate, and a coil are disposed on a substrate sequentially may be provided. In addition, the magneto resistive thin plates may be provided in a plurality of planes parallel to the plane in which the plane coil lies. The bearing sensors of three-layered type will be described below with reference to EXAMPLES 9 through 12.

EXAMPLE 9

Figure 16:
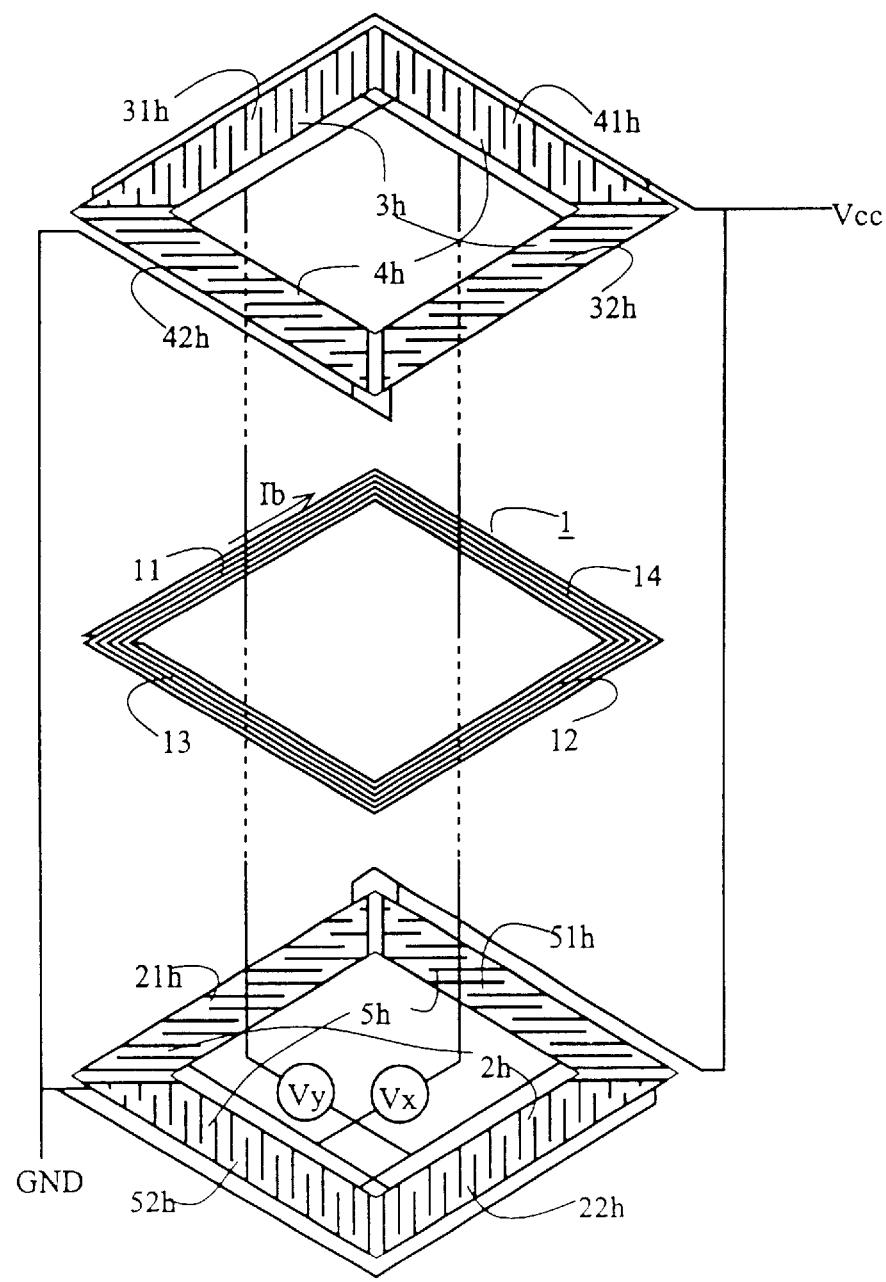
FIG. 16 is an exploded perspective view of the bearing sensor of EXAMPLE 9 of the present invention.
Figure 17:
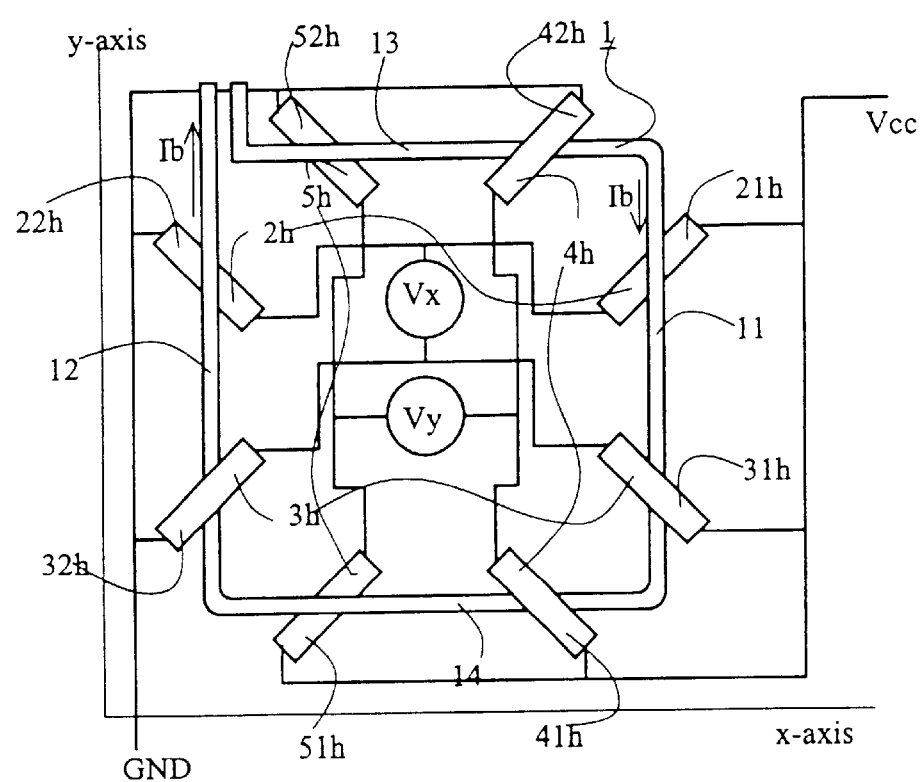
FIG. 17 is a circuit diagram of the bearing sensor of EXAMPLE 9 of the present invention.

FIGS. 16 and 17 show EXAMPLE 9 of the bearing according to the present invention. In these drawings, the same components as those shown in the drawings already explained are denoted by the same reference numerals. FIG. 16 is an exploded perspective view of the bearing sensor of EXAMPLE 9, showing the bearing sensor consisting of a plane coil 1 and magneto resistive element planes provided on both sides of the plane coil so as to be adjacent and parallel thereto. The plane coil 1 is the same as that described in EXAMPLES 1 through 4. That is, it has two pairs of parallel opposed conductor sides 11 and 12, and 13 and 14, the two pairs of opposed conductor sides constitute at least partially four side of a rectangle (four sides of a square, herein), and the plane coil 1 consists of several tens of turns. The magneto resistive element plane under the plane coil includes four magneto resistive thin plates 21h, 22h, 51h, and 52h, and the magneto resistive element plane above the plane coil includes four magneto resistive thin plates 31h, 32h, 41h, and 42h. The longitudinal direction of each of the magneto resistive thin plates crosses each side of the opposed conductor side pairs of the plane coil at an angle more than 30 degrees and less than 90 degrees. For more readily understanding of this relationship, the circuit is schematically shown in FIG. 17. When a current is passed through the plane coil 1 in the direction of Ib, in the magneto resistive thin plates crossing the sides 11 and 12 of one opposed conductor side pair, a magnetic field in x direction is applied to the magneto resistive thin plates 21h and 32h, a magnetic field in −x direction is applied to the magneto resistive thin plates 31h and 22h. And in the magneto resistive thin plates crossing the sides 13 and 14 of one opposed conductor side pair, a magnetic field in y direction is applied to the magneto resistive thin plates 41h and 52h, and a magnetic field in −y direction is applied to the magneto resistive thin plates 51h and 42h. Here, the magneto resistive thin plates 21h and 22h, 31h and 32h, 41h and 42h, and 51h and 52h which are applied with the opposite magnetic fields, constitute magneto resistive element pairs 2h, 3h, 4h, and 5h, respectively. Each of the magneto resistive thin plates of each of the magneto resistive element pairs is connected to the other at one terminal thereof, and the voltage Vcc for measuring is applied between the other terminals, and the intermediate potential output is taken out from the connected terminals. In this EXAMPLE, the intermediate potential output difference is taken out.

From the above description, it is apparent that an external magnetic field is exerted on the magneto resistive element pairs 2h, 3h, 4h, and 5h in this EXAMPLE in the same manner as the external magnetic field exerted on the magneto resistive element pair 2, 3, 4, and 5 in EXAMPLE 1. Therefore, it will be apparently seen that the bearing sensor of this EXAMPLE can measure bearings in the same manner as that of EXAMPLE 1.

However, as readily seen from comparison between FIGS. 2 and 16, assuming that the two-dimensional size of the bearing sensor is the same for both cases, the area of the magneto resistive thin plate used in FIG. 16 is twice as large as that in FIG. 2. Therefore, assuming that the thickness of the thin plate is the same for both cases, the resistance of the magneto resistive thin plate can be accordingly increased so that the power consumption can be reduced. If the area of one magneto resistive thin plate is the same for both cases, the size of the plane coil 1 can be reduced, and the power consumption of the coil can be reduced. In addition, since the number of the long strips constituting the magneto resistive thin plate is increased so that the magnetic shape anisotropy is stabilized. Other advantages may also be provided.

EXAMPLE 10

Figure 18:
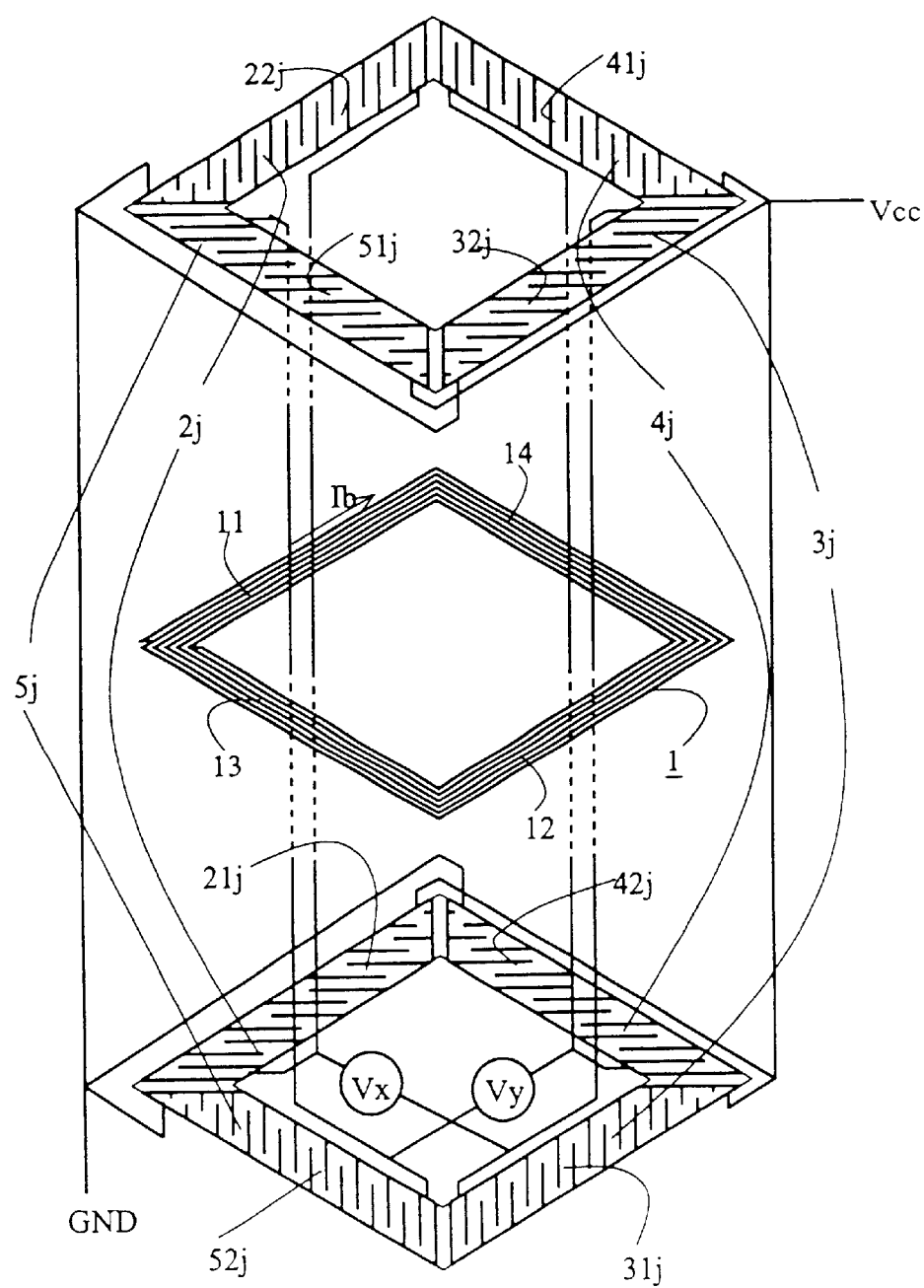
FIG. 18 is an exploded perspective view of the bearing sensor of EXAMPLE 10 of the present invention.
Figure 19:
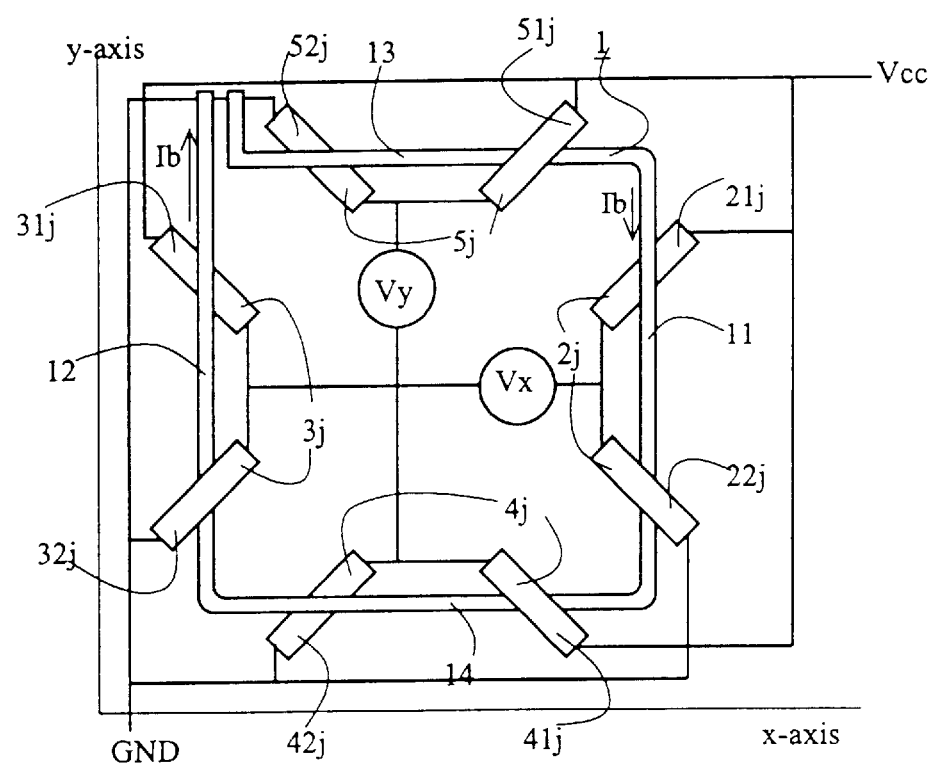
FIG. 19 is a circuit diagram of the bearing sensor of EXAMPLE 10 of the present invention.

FIGS. 18 and 19 show EXAMPLE 10 of the present invention. FIG. 18 is an exploded perspective view, in which magneto resistive element planes are provided on both sides of the plane coil 1 so as to be adjacent and parallel thereto, and the arrangement of the magneto resistive thin plates in the upper and lower magneto resistive element planes is the same as that shown in FIG. 16. Here, magneto resistive thin plates 21j and 22j, 31j and 32j, 41j and 42j, and 51j and 52j that sandwich the respective sides of the plane coil constitute magneto resistive element pairs 2j, 3j, 4j, and 5j, respectively. Since the two magneto resistive thin plates 21j and 22j of the magneto resistive element pair 2j are disposed under and above the coil side 11, respectively, when a direct current is passed through the coil, magnetic fields of opposite directions are applied to them. Similarly, in the magneto resistive element pairs 3j, 4j, and 5j, magnetic fields of opposite directions are applied to the magneto resistive thin plates 31j and 32j, and 41j and 42j, and 51j and 52j, respectively. Furthermore, the longitudinal directions of the two magneto resistive thin plates of each of the magneto resistive element pairs are perpendicular to each other in this drawing.

In this bearing sensor, when the horizontal component He of the earth magnetism is applied at an angle of θ with respect to x axis, the intermediate potential output difference is exactly the same as that in EXAMPLE 9. Therefore, the angle θ of the horizontal component He of the earth magnetism with respect to x axis can be represented by:

$$\theta = a\tan(V \text{ in } y \text{ direction}/V \text{ in } x \text{ direction}).$$

EXAMPLE 11

Figure 20:
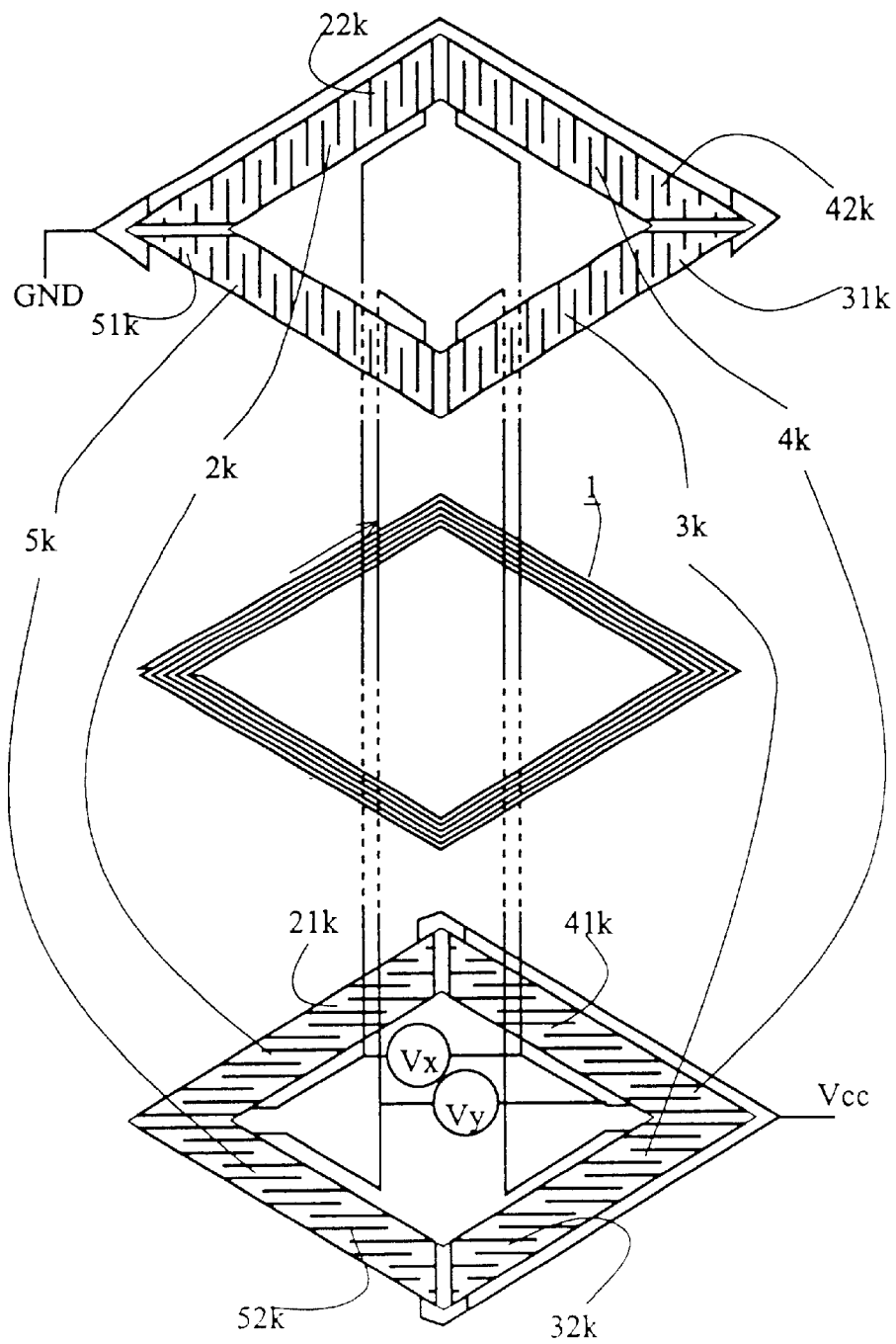
FIG. 20 is an exploded perspective view of the bearing sensor of EXAMPLE 11 of the present invention.
Figure 21:
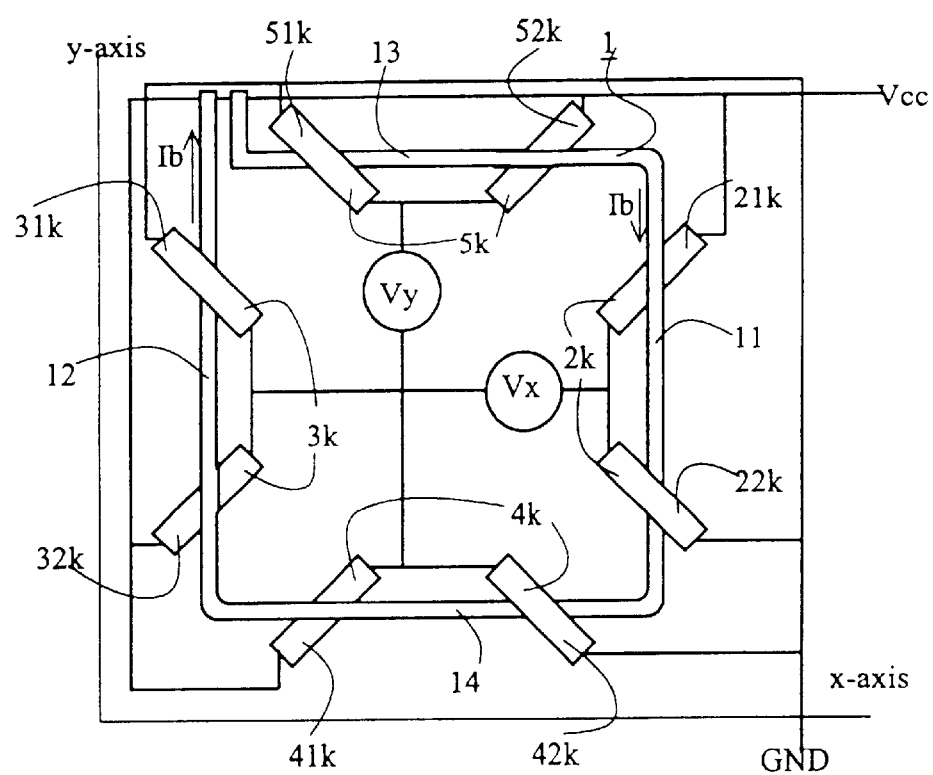
FIG. 21 is a circuit diagram of the bearing sensor of EXAMPLE 11 of the present invention.

FIGS. 20 and 21 show EXAMPLE 11 of the present invention. FIG. 20 is an exploded perspective view, in which the plane coil 1 is identical to that in FIG. 16. The longitudinal directions of four magneto resistive thin plates 22k, 31k, 42k, and 51k in the upper magneto resistive element planes are parallel to each other, and the longitudinal directions of four magneto resistive thin plates 21k, 32k, 41k, and 52k in the lower magneto resistive element planes are parallel to each other. The longitudinal directions crosses the respective coil sides at 45 degrees. Magneto resistive thin plates 21k and 22k, 31k and 32k, 41k and 42k, and 51k and 52k that sandwich the respective sides of the plane coil constitute magneto resistive element pairs 2k, 3k, 4k, and 5k, respectively. Since the two magneto resistive thin plates 21k and 22k of the magneto resistive element pair 2k are disposed under and above the coil side 11, respectively, when a direct current is passed through the coil, magnetic fields of opposite directions are applied to them. Similarly, in the magneto resistive element pairs 3k, 4k, and 5k, magnetic fields of opposite directions are applied to the magneto resistive thin plates 31k and 32k, and 41k and 42k, and 51k and 52k, respectively. Furthermore, the longitudinal directions of the two magneto resistive thin plates of each of the magneto resistive element pairs are perpendicular to each other in this drawing.

In this bearing sensor, when the horizontal component He of the earth magnetism is applied at an angle of θ with respect to x axis, the intermediate potential output difference is exactly the same as that in the first example. Therefore, the angle θ of the horizontal component He of the earth magnetism with respect to x axis can be represented by:

$$\theta = a\tan(V \text{ in } y \text{ direction}/V \text{ in } x \text{ direction}).$$

EXAMPLE 12

Figure 22:
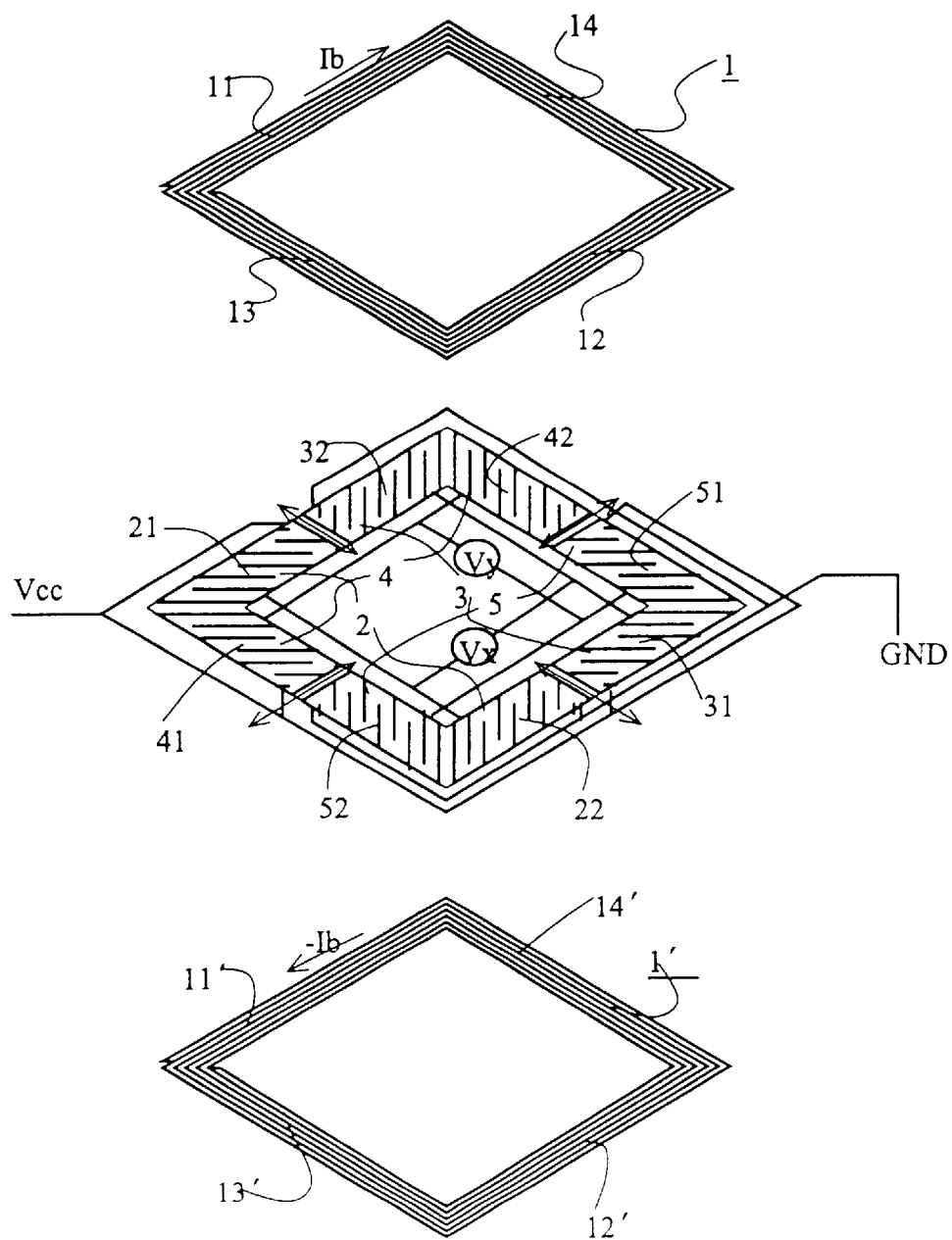
FIG. 22 is an exploded perspective view of the bearing sensor of EXAMPLE 12 of the present invention.
Figure 23:
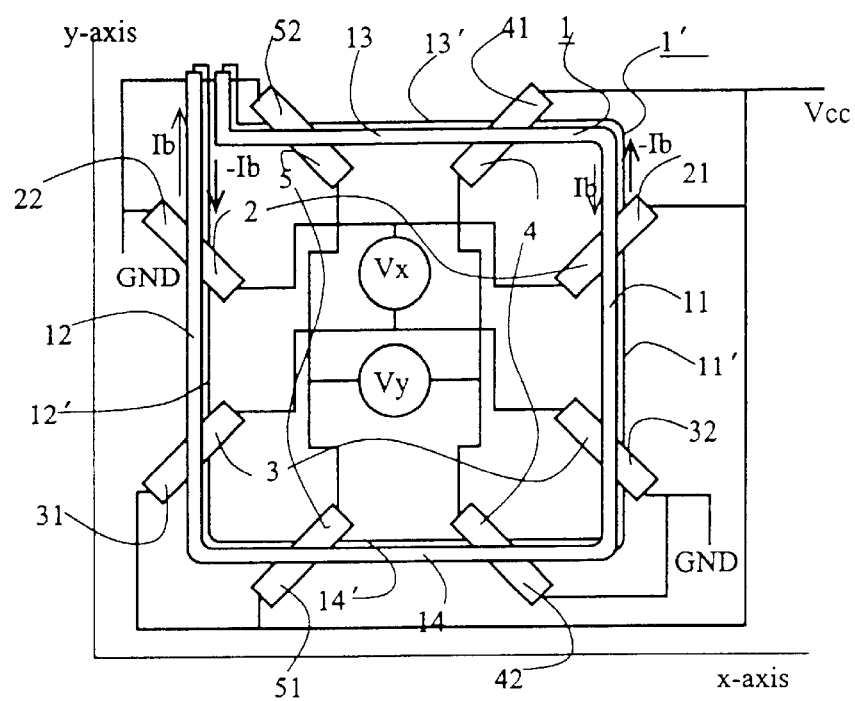
FIG. 23 is a circuit diagram of the bearing sensor of EXAMPLE 12 of the present invention.

FIGS. 22 and 23 show EXAMPLE 12 of the bearing sensor according to the present invention. FIG. 22 is an exploded perspective view of the bearing sensor having a magneto resistive element plane and two plane coils 1 and 1' that are arranged on both sides of the magneto resistive element plane so as to be adjacent and parallel thereto. The magneto resistive element plane includes magneto resistive thin plates 21, 22, 31, 32, 41, 42, 51, and 52. The plane coil 1 has at least two pairs of opposed conductor sides 11 and 12, and 13 and 14, the sides being parallel to each other in each of the pairs, and the two opposed conductor side pairs constitute at least partially four sides of a rectangle (four sides of a square, herein). The plane coil 1' has at least two pairs of opposed conductor sides 11' and 12', and 13' and 14', the sides being parallel to each other in each of the pairs, and the two opposed conductor side pairs constitute at least partially four sides of a rectangle (four sides of a square, herein). The plane coil 1 and magneto resistive thin plates used in EXAMPLE 12 are the same as those used in EXAMPLE 1. While the plane coil 1' is substantially the same as the plane coil 1, the directions of the current flowing through them are opposite to each other.

The coil side 11 of the parallel opposed conductor side pair of the plane coil 1 and the coil side 11' of the parallel opposed conductor side pair of the plane coil 1' are arranged to be parallel to each other, and the longitudinal directions of the magneto resistive thin plates 21 and 32 sandwiched between the coil sides cross the coil sides at an angle more than 30 degrees and less than 90 degrees, preferably no less than 45 degrees and less than 90 degrees, and specifically 45 degrees in this EXAMPLE. The coil sides 12 and 12' of the opposed conductor side pairs that are opposed to each other are arranged to be parallel to each other, and the longitudinal directions of the magneto resistive thin plates 31 and 22 sandwiched between the coil sides cross the coil sides at an angle more than 30 degrees and less than 90 degrees, preferably no less than 45 degrees and less than 90 degrees, and specifically 45 degrees in this EXAMPLE. The coil sides 13 and 13' that are perpendicular to the opposed conductor side pairs are arranged to be parallel to each other, and the longitudinal directions of the magneto resistive thin plates 41 and 52 sandwiched between the coil sides cross the coil sides at an angle more than 30 degrees and less than 90 degrees, preferably no less than 45 degrees and less than 90 degrees, and specifically about 45 degrees in this EXAMPLE. The coil sides 14 and 14' opposed to the coil sides 13 and 13', respectively, are arranged to be parallel to each other, and the longitudinal directions of the magneto resistive thin plates 51 and 42 sandwiched between the coil sides cross the coil sides at an angle more than 30 degrees and less than 90 degrees, preferably no less than 45 degrees and less than 90 degrees, and specifically about 45 degrees in this EXAMPLE. The magneto resistive thin plates 21 and 32, 31 and 22, 41 and 52, and 51 and 42 that cross the respective sides of the plane coils 1 and 1' have longitudinal directions not parallel to one another, in particular, perpendicular to one another in this drawing. In addition, the magneto resistive thin plates 21 and 22 having longitudinal directions crossing the sides of the parallel opposed conductor side pair constitute the magneto resistive element pair 2, and the longitudinal directions of the magneto resistive thin plates 21 and 22 are not parallel to one another, in particular, perpendicular to one another in this drawing. Similarly, the magneto resistive thin plates 31 and 32, 41 and 42, and 51 and 52, each pair having longitudinal directions crossing the sides of the parallel opposed conductor side pair, constitute the magneto resistive element pairs 3, 4, and 5, respectively, and the longitudinal directions of the magneto resistive thin plates 31 and 32, of the magneto resistive thin plates 41 and 42, and of the magneto resistive thin plates 51 and 52 are not parallel to one another, in particular, perpendicular to one another in this drawing. Each of the magneto resistive thin plates constituting the magneto resistive element pairs 2, 3, 4, and 5, respectively, is connected to the other at one terminal thereof, in particular, at a terminal on the inner side of the plane coils 1 and 1' in this drawing. And, the voltage Vcc for measuring is applied between the other terminals of the magneto resistive element pairs to measure the potential difference between the connected terminals.

The magneto resistive thin plates are provided in a plane that is sandwiched between the plane coils 1 and 1' and is adjacent and parallel thereto. The plane coils 1 and 1' consist of several tens of turns in a same direction, and when direct currents are passed through the both coils in the opposite directions, a DC magnetic field is generated in a direction from the inside to the outside of the coil or vice versa in the parallel plane between the plane coils, that is, the magneto resistive element plane, so that the DC magnetic field is applied to the magneto resistive element pairs. In FIGS. 22 and 23, when a current Ib passes through the plane coil 1 in a clockwise direction, and a current −Ib passes through the plane coil 1' in a counterclockwise direction, a magnetic field in x direction is applied to the magneto resistive thin plates 21 and 32, a magnetic field in the −x direction is applied to the magneto resistive thin plates 22 and 31, a magnetic field in the y direction is applied to the magneto resistive thin plates 41 and 52, and a magnetic field in the −y direction is applied to the magneto resistive thin plates 42 and 51. If the current −Ib in the opposite direction passes through the plane coil 1, and the current Ib passes through the plane coil 1', a magnetic field in the opposite direction is applied to each of the magneto resistive thin plates. Thus, it will be understood that the bearing sensor of this example operates the same as the bearing sensor of EXAMPLE 1.

The plane coils 1 and 1' may be connected to a power supply circuit in series or in parallel. Attaining a certain magnetic field strength with two parallel coils requires a current of half the amount needed for attaining the same level of magnetic field strength with one coil. In the case of serial connection, a power required in the case of two coils can be half the power consumed by one coil.

As described above in detail, according to the present invention, since the plane coil is used to apply the saturation magnetic field and biasing magnetic field to the magneto resistive thin plates, the coil can be made of a thin film, and therefore, the thickness and are of the bearing sensor can be reduced.

With the bearing sensor of the present invention, bearings can be measured by applying biasing magnetic fields in x and y directions simultaneously, so that the number of measurements of bearings can be halved compared to a conventional technique.

In addition, with the process for bearings according to the present invention, since a biasing magnetic field of a predetermined strength is applied in such a manner that the directions of the applied saturation magnetic field and biasing magnetic field are opposite to each other, the output can be increased.

In addition, the bearing sensor of the present invention can be used as a current sensor or a sensor for a weak magnetic field rather than the earth magnetism. In addition, a small motion sensor incorporating the bearing sensor of the present invention and acceleration sensor can be realized. Since the bearing sensor of the present invention is small, it can be incorporated in a watch, cellular phone, portable computer or the like to realize a positioning system using bearings.

What is claimed is:

1. A bearing sensor comprising:
   a plane coil having at least a pair of opposed conductor sides, the opposed conductor side pair composed of a first side and a second side which are parallel to one another, and
   at least one magneto resistive element pair of two magneto resistive thin plates located on a plane parallel to and adjacent to the plane coil,
   the magneto resistive element pair having a first magneto resistive thin plate and a second magneto resistive thin plate,
   the first magneto resistive thin plate of the magneto resistive element pair having a longitudinal direction crossing only the first side at an angle of more than 30 degrees and less than 90 degrees,
   the second magneto resistive thin plate of the magneto resistive element pair having a longitudinal direction crossing only the second side at an angle of more than 30 degrees and less than 90 degrees,
   the longitudinal direction of the first magneto resistive thin plate being not parallel to the longitudinal direction of the second magneto resistive thin plate, and
   each of the magneto resistive thin plates electrically connected at one terminal thereof to the other and a voltage for measuring bearings is applied between the other terminals so that a potential is taken out from the one terminal according to bearings.

2. A bearing sensor as set forth in claim 1, wherein the plane coil has two pairs of the opposed conductor sides.

3. A bearing sensor as set forth in claim 2, wherein the two pairs of the opposed conductor sides constitute at least partially four sides of a rectangle.

4. A bearing sensor as set forth in claim 2, comprising two magneto resistive element pairs, each of the magneto resistive element pairs having two magneto resistive thin plates composed of a first magneto resistive thin plate and a second magneto resistive thin plate.

5. A bearing sensor as set forth in claim 4, wherein each of the first magneto resistive thin plates in the two magneto resistive element pairs crosses only a first side of the opposed conductor side pair,
  each of the second magneto resistive thin plates in the two magneto resistive element pairs crosses only a second side, opposite to the first side, of the opposed conductor side pair,
  the longitudinal directions of the first magneto resistive thin plates crossing the first side of the opposed conductor side pair are not parallel to one another and
  the longitudinal directions of the second magneto resistive thin plates crossing the second side of the opposed conductor side pair are not parallel to one another.

6. A bearing sensor as set forth in claim 4, wherein the first magneto resistive thin plate of one of the two magneto resistive element pairs crosses only the first side of one of the two opposed conductor side pairs and the second magneto resistive thin plate of the magneto resistive element pair crosses only the second side of the opposed conductor side pair, while the first magneto resistive thin plate of the other of the two magneto resistive element pairs crosses only the first side of the other of the two opposed conductor side pairs and the second magneto resistive thin plate of the other of the two magneto resistive element pairs crosses only the second side of the other of the two opposed conductor side pairs.

7. A bearing sensor as set forth in claim 4, wherein the angle at which the longitudinal direction of each of the magneto resistive thin plates crosses a side of the opposed conductor side pair of the plane coil is more than or equal to 45 degrees and less than 90 degrees.

8. A bearing sensor as set forth in claim 7, wherein the variation in an angle at which the longitudinal direction of each of the magneto resistive thin plates in each of the magneto resistive element pairs crosses a side of the opposed conductor side pair of the plane coil is within +/−5 degrees.

9. A bearing sensor as set forth in claim 7, wherein the angle at which the longitudinal direction of each of the magneto resistive thin plates crosses a side of the opposed conductor side pair of the plane coil is about 45 degrees.

10. A bearing sensor as set forth in claim 7, wherein the longitudinal direction of one of the magneto resistive thin plates in each of the magneto resistive element pairs is perpendicular to the longitudinal direction of the other of the magneto resistive thin plates in the same magneto resistive element pair.

11. A bearing sensor as set forth in claim 9, wherein the longitudinal direction of one of the magneto resistive thin plates in each of the magneto resistive element pairs is perpendicular to the longitudinal direction of the other of the magneto resistive thin plates in the same magneto resistive element pair.

12. A bearing sensor as set forth in claim 3, comprising four magneto resistive element pairs, each of the magneto resistive element pairs having two magneto resistive thin plates composed of a first magneto resistive thin plate and a second magneto resistive thin plate,
  wherein two first magneto resistive thin plates of two of the four magneto resistive element pairs cross only the first side of one of the two opposed conductor side pairs and two second magneto resistive thin plates of the two magneto resistive element pairs cross only the second side of the same opposed conductor side pair,
  while two first magneto resistive thin plates of the other two of the four magneto resistive element pairs cross only the first side of the other opposed conductor side pair and two second magneto resistive thin plates of the other two magneto resistive element pairs cross only the second side of the other opposed conductor side pair, the longitudinal directions of the two magneto resistive thin plates crossing the same side of the plane coil being not parallel to one another.

13. A bearing sensor as set forth in claim 12, wherein the angle at which the longitudinal direction of each of the magneto resistive thin plates crosses a side of the opposed conductor side pair of the plane coil is more than or equal to 45 degrees and less than 90 degrees.

14. A bearing sensor as set forth in claim 13, wherein the variation in an angle at which the longitudinal direction of each of the magneto resistive thin plates in each of the magneto resistive element pairs crosses a side of the opposed conductor side pair of the plane coil is within +/−5 degrees.

15. A bearing sensor as set forth in claim 13, wherein the angle at which the longitudinal direction of each of the magneto resistive thin plates crosses a side of the opposed conductor side pair of the plane coil is about 45 degrees.

16. A bearing sensor as set forth in claim 13, wherein the longitudinal direction of one of the magneto resistive thin plates in each of the magneto resistive element pairs is perpendicular to the longitudinal direction of the other of the magneto resistive thin plates in the same magneto resistive element pair.

17. A bearing sensor as set forth in claim 15, wherein the longitudinal direction of one of the magneto resistive thin plates in each of the magneto resistive element pairs is perpendicular to the longitudinal direction of the other of the magneto resistive thin plates in the same magneto resistive element pair.

18. A bearing sensor as set forth in claim 1, wherein the plane coil is a cross-shaped plane coil wound along outside of a cross-shaped plane and has four pairs of the opposed conductor sides,
  each of the opposed conductor side pairs composed of a first side of the opposed conductor side pair and a second side of the opposed conductor side pair,
  each side of the opposed conductor side pair located between a top corner and a bottom corner on a side of a protrusion of the cross-shaped plane,
  the first side of each of the opposed conductor side pairs being parallel to the second side of the same opposed conductor side pair,
  the sides of two of the four opposed conductor side pairs being parallel to one another and perpendicular to the side of the other two of the four opposed conductor side pairs.

19. A bearing sensor as set forth in claim 18, comprising two magneto resistive element pairs, each of the magneto resistive element pairs having two magneto resistive thin plates composed of a first magneto resistive thin plate and a second magneto resistive thin plate.

20. A bearing sensor as set forth in claim 18, comprising four magneto resistive element pairs, each of the magneto resistive element pairs having two magneto resistive thin plates composed of a first magneto resistive thin plate and a second magneto resistive thin plate, wherein the first magneto resistive thin plates in two of the four magneto resistive element pairs cross, respectively, only the first sides, which are parallel to one another, in first two of the four opposed conductor side pairs and the second magneto resistive thin plates in the two magneto resistive element pairs cross, respectively, only the second sides in the first two opposed conductor side pairs which are parallel to one another, while the first magneto resistive thin plates in the other two of the four magneto resistive element pairs cross, respectively, only the first sides of the other two of the four opposed conductor side pairs which are perpendicular to the first two opposed conductor side pairs and the second magneto resistive thin plates of the other two magneto resistive element pairs cross, respectively, only the second sides of the other two of the four opposed conductor side pairs, and the longitudinal direction of the first magneto resistive thin plate of the magneto resistive element pair at a protrusion of the cross-shaped plane coil is not parallel to the longitudinal direction of the first magneto resistive thin plate of the magneto resistive element pair at the opposite protrusion and the longitudinal direction of the second magneto resistive thin plate of the magneto resistive element pair at the protrusion is not parallel to the longitudinal direction of the second magneto resistive thin plate of the magneto resistive element pair at the opposite protrusion.

21. A bearing sensor as set forth in claim 20, wherein the angle at which the longitudinal direction of each of the magneto resistive thin plates crosses a side of the opposed conductor side pair of the plane coil is more than or equal to 45 degrees and less than 90 degrees.

22. A bearing sensor as set forth in claim 21, wherein the variation in an angle at which the longitudinal direction of each of the magneto resistive thin plates in each of the magneto resistive element pairs crosses a side of the opposed conductor side pair of the plane coil is within +/−5 degrees.

23. A bearing sensor as set forth in claim 21, wherein the angle at which the longitudinal direction of each of the magneto resistive thin plates crosses a side of the opposed conductor side pair of the plane coil is about 45 degrees.

24. A bearing sensor as set forth in claim 23, wherein the longitudinal direction of the first magneto resistive thin plate of each of the four magneto resistive element pairs is perpendicular to the longitudinal direction of the second magneto resistive thin plate of the same magneto resistive element pair crossing the opposed conductor side pair that the first magneto resistive thin plate crosses and the longitudinal direction of each of the first and the second magneto resistive thin plates at a protrusion of the cross-shaped plane coil is perpendicular to the longitudinal direction of one of the magneto resistive thin plates crossing the sides of the opposed conductor side pair at the other protrusion opposite to the protrusion.

25. A bearing sensor as set forth in claim 21, wherein the longitudinal direction of the first magneto resistive thin plate of each of the four magneto resistive element pairs is perpendicular to the longitudinal direction of the second magneto resistive thin plate of the same magneto resistive element pair crossing the opposed conductor side pair that the first magneto resistive thin plate crosses and the longitudinal direction of each of the first and the second magneto resistive thin plates at a protrusion of the cross-shaped plane coil is perpendicular to the longitudinal direction of one of the magneto resistive thin plates crossing the sides of the opposed conductor side pair at the other protrusion opposite to the protrusion.

26. A bearing sensor comprising:

a plane coil having two pairs of opposed conductor sides parallel to one another, the two pairs of the opposed conductor sides constituting at least partially four sides of a rectangle, the opposed conductor side pair composed of a first side and a second side, two magneto resistive element planes located at both sides of the plane coil and being parallel to and adjacent to the plane coil, each of the magneto resistive element planes having four magneto resistive thin plates having a longitudinal direction crossing only a single side of the opposed conductor side pair at an angle of more than 30 degrees and less than 90 degrees, wherein two magneto resistive thin plates of which the longitudinal directions cross a pair of the opposed conductor sides and are not parallel to one another constitute a magneto resistive element pair of the magneto resistive thin plates having a first magneto resistive thin plate and a second magneto resistive thin plate, the first and the second magneto resistive thin plates being applied opposite magnetic fields by a DC current flowing through the plane coil, each of the magneto resistive thin plates electrically connected at one terminal thereof to the other and a voltage for measuring bearings is applied between the other terminals so that a potential is taken out from the one terminal according to bearings.

27. A bearing sensor as set forth in claim 26, wherein the angle at which the longitudinal direction of each of the magneto resistive thin plates crosses a side of the opposed conductor side pair of the plane coil is more than or equal to 45 degrees and less than 90 degrees.

28. A bearing sensor as set forth in claim 27, wherein the variation in an angle at which the longitudinal direction of each of the magneto resistive thin plates in each of the magneto resistive element pairs crosses a side of the opposed conductor side pair of the plane coil is within +/−5 degrees.

29. A bearing sensor as set forth in claim 27, wherein the angle at which the longitudinal direction of each of the magneto resistive thin plates crosses a side of the opposed conductor side pair of the plane coil is about 45 degrees.

30. A bearing sensor as set forth in claim 29, wherein the longitudinal direction of one of the magneto resistive thin plates in each of the magneto resistive element pairs is perpendicular to the longitudinal direction of the other of the magneto resistive thin plates in the same magneto resistive element pair and the longitudinal directions of two magneto resistive thin plates between which a side of the opposed conductor side pair is put are perpendicular to one another.

31. A bearing sensor as set forth in claim 27, wherein the longitudinal direction of one of the magneto resistive thin plates in each of the magneto resistive element pairs is perpendicular to the longitudinal direction of the other of the magneto resistive thin plates in the same magneto resistive element pair and the longitudinal directions of two magneto resistive thin plates between which a side of the opposed conductor side pair is put are perpendicular to one another.

32. A bearing sensor comprising:

a magneto resistive element plane and two plane coils located on both sides of the magneto resistive element plane and being parallel to and adjacent to the magneto resistive element plane, each of the two plane coils having at least two pairs of opposed conductor sides, the two pairs of the opposed conductor sides constituting at least four sides of a rectangle, the opposed conductor side pair composed of a first side and a second side which are parallel to one another, the magneto resistive element plane having two magneto resistive thin plates per a side of the opposed conductor side pair of the plane coils, the two magneto resistive thin plates having longitudinal directions crossing only the side of the opposed conductor side pair at an angle of more than 30 degrees and less than 90 degrees and being not parallel to one another, wherein a magneto resistive element pair is composed of one of the magneto resistive thin plates crossing the first side of the opposed conductor side pair of the two plane coils and the magneto resistive thin plate crossing the second side of the opposed conductor side pair of the two plane coils and being not parallel to the longitudinal direction of the one of the magneto resistive thin plates, and each of the magneto resistive thin plates electrically connected at one terminal thereof to the other and a voltage for measuring bearings is applied between the other terminals so that an intermediate potential is taken out from the one terminal according to bearings.

33. A bearing sensor as set forth in claim 32, wherein the angle at which the longitudinal direction of each of the magneto resistive thin plates crosses a side of the opposed conductor side pair of the plane coil is more than or equal to 45 degrees and less than 90 degrees.

34. A bearing sensor as set forth in claim 33, wherein the magneto resistive element plane has two magneto resistive thin plates per a side of the opposed conductor side pair of the plane coils, the two thin plates have longitudinal directions crossing only the side of the opposed conductor side pair at an angle of about 45 degrees and are perpendicular to one another and longitudinal directions of two thin plates of a magneto resistive element pair are perpendicular to one another.

35. A process for bearings, comprising the steps of providing a sensor comprising:

a plane coil having two pairs of opposed conductor sides, the opposed conductor side pair composed of a first side and a second side which are parallel to one another, and at least one magneto resistive element pair of two magneto resistive thin plates located on a plane parallel to and adjacent to the plane coil, the magneto resistive element pair having a first magneto resistive thin plate and a second magneto resistive thin plate, the first magneto resistive thin plate of the magneto resistive element pair having a longitudinal direction crossing only the first side at an angle of more than 30 degrees and less than 90 degrees, the second magneto resistive thin plate of the magneto resistive element pair having a longitudinal direction crossing only the second side at an angle of more than 30 degrees and less than 90 degrees, the longitudinal direction of the first magneto resistive thin plate being not parallel to the longitudinal direction of the second magneto resistive thin plate, each of the magneto resistive thin plates electrically connected at one terminal thereof to the other, passing a first DC current through the plane coil to apply to the magneto resistive thin plates a DC magnetic field enough to saturate a magnetization of the magneto resistive thin plates in the longitudinal direction of each of the magneto resistive thin plates, passing a first biasing DC current opposite to the first DC current through the plane coil to apply a biasing DC magnetic field perpendicular to the longitudinal direction, applying a voltage for measuring bearings between the other terminals of the magneto resistive element pairs to take out a first intermediate potential from the connected terminals of the magneto resistive element pairs during the application of the biasing DC magnetic field, passing a second DC current opposite to the first DC current through the plane coil to apply to the magneto resistive thin plates a DC magnetic field enough to saturate a magnetization of the magneto resistive thin plates in the longitudinal direction of each of the magneto resistive thin plates, passing a second biasing DC current opposite to the second DC current through the plane coil to apply a biasing DC magnetic field perpendicular to the longitudinal direction, applying a voltage for measuring bearings between the other terminals of the magneto resistive element pairs to take out a second intermediate potential from the connected terminals of the magneto resistive element pairs during the application of the biasing DC magnetic field, and obtaining a difference between the first and the second intermediate potentials to measure bearings from the difference.

36. A process as set forth in claim 35, wherein the sensor comprises two magneto resistive element pairs of magneto resistive thin plates, the two first magneto resistive thin plates of the two magneto resistive element pairs having longitudinal directions crossing only the first sides of the opposed conductor side pairs at an angle of more than 30 degrees and less than 90 degrees, the two second magneto resistive thin plates of the two magneto resistive element pairs having longitudinal directions crossing only the second sides of the opposed conductor side pairs at an angle of more than 30 degrees and less than 90 degrees, the longitudinal directions of the first magneto resistive thin plates being not parallel to the longitudinal directions of the second magneto resistive thin plates and the longitudinal directions of the first and the second magneto resistive thin plates crossing a side of the opposed conductor side pair being not parallel to one another, and instead of the first and the second intermediate potentials, a first and a second intermediate potential differences between two magneto resistive element pairs crossing a same opposed conductor side pair are taken out and a difference between the first and the second intermediate potential differences is obtained to measure bearings from the difference.

37. A process as set forth in claim 35, wherein the sensor comprises four magneto resistive element pairs, each of the magneto resistive element pairs having two magneto resistive thin plates composed of a first magneto resistive thin plate and a second magneto resistive thin plate, wherein two first magneto resistive thin plates of two of the four magneto resistive element pairs cross only the first side of one of the two opposed conductor side pairs and two second magneto resistive thin plates of the two magneto resistive element pairs cross only the second side of the same opposed conductor side pair, while two first magneto resistive thin plates of the other two of the four magneto resistive element pairs cross only the first side of the other opposed conductor side pair and two second magneto resistive thin plates of the other two magneto resistive element pairs cross only the second side of the other opposed conductor side pair, the longitudinal directions of the two magneto resistive thin plates crossing the same side of the plane coil being not parallel to one another, and instead of the first and the second intermediate potentials, a first and a second intermediate potential differences between two magneto resistive element pairs crossing a same opposed conductor side pair are taken out and a difference between the first and the second intermediate potential differences is obtained to measure bearings from the difference.

38. A process as set forth in claim 37, wherein the angle at which the longitudinal direction of each of the magneto resistive thin plates crosses a side of the opposed conductor side pair of the plane coil is more than or equal to 45 degrees and less than 90 degrees.

39. A process as set forth in claim 37, wherein the angle at which the longitudinal direction of each of the magneto resistive thin plates crosses a side of the opposed conductor side pair of the plane coil is about 45 degrees.

40. A process as set forth in claim 37, wherein the plane coil is a rectangle, the longitudinal direction of one of the magneto resistive thin plates in each of the magneto resistive element pairs is perpendicular to the longitudinal direction of the other of the magneto resistive thin plates in the same magneto resistive element pair, and the longitudinal directions of the magneto resistive thin plates crossing a same side of the plane coil are perpendicular to one another.

41. A process as set forth in claim 39, wherein the plane coil is a rectangle, the longitudinal direction of one of the magneto resistive thin plates in each of the magneto resistive element pairs is perpendicular to the longitudinal direction of the other of the magneto resistive thin plates in the same magneto resistive element pair, and the longitudinal directions of the magneto resistive thin plates crossing a same side of the plane coil are perpendicular to one another.

* * * * *